US012768858B2

(12) United States Patent
Miyaaki

(10) Patent No.: US 12,768,858 B2
(45) **Date of Patent: *Oct. 20, 2026**

(54) CONTACT PIN AND SOCKET FOR INSPECTION

(71) Applicant: Yamaichi Electronics Co., Ltd., Tokyo (JP)

(72) Inventor: Junichi Miyaaki, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 159 days.

This patent is subject to a terminal disclaimer.

(21) Appl. No.: 18/220,328

(22) Filed: Jul. 11, 2023

(65) Prior Publication Data

US 2024/0019462 A1 Jan. 18, 2024

(30) Foreign Application Priority Data

Jul. 12, 2022 (JP) ................................ 2022-111828

(51) Int. Cl.
*G01R 1/067* (2006.01)
*G01R 1/073* (2006.01)

(52) U.S. Cl.
CPC ..... *G01R 1/06722* (2013.01); *G01R 1/07307* (2013.01)

(58) Field of Classification Search
CPC ................ G01R 1/06722; G01R 1/067; G01R 1/06705; G01R 1/06711; G01R 1/06716;
(Continued)

(56) References Cited

U.S. PATENT DOCUMENTS 4,773,877 A 9/1988 Kruger et al.
5,865,641 A * 2/1999 Swart .................. H01R 12/721 439/482

(Continued)

FOREIGN PATENT DOCUMENTS

JP H08-015384 A 1/1996
JP 2004212233 A 7/2004

(Continued)

OTHER PUBLICATIONS

Machine translation of KR-20180095315-A (Year: 2018).*

(Continued)

*Primary Examiner* — Lee E Rodak
*Assistant Examiner* — Jeremiah J Barron
(74) *Attorney, Agent, or Firm* — Panitch Schwarze Belisario & Nadel LLP

(57) ABSTRACT

Provided are a contact pin and a socket for inspection that can improve electrical performance or thermal performance. An embodiment includes: an electric conductive electrical contact extending from the base end to the tip and having an elastic deformation part elastically expandable and compressible in the extending direction formed between the base end and the tip; an electric conductive thermal contact extending from the base end to the tip and having an elastic deformation part elastically expandable and compressible in the extending direction formed between the base end and the tip; and an electrically conductive casing that bundles the electrical contact and the thermal contact laterally stacked adjacent to each other, and the casing is in contact with the electrical contact and the thermal contact so as to form a path bypassing the elastic deformation part.

13 Claims, 32 Drawing Sheets

(58) Field of Classification Search
CPC ............ G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392; G01R 1/06–073; G01R 31/26–27; H01R 13/00–08; H01R 13/15–35; H01R 33/00–975
See application file for complete search history.

(56) References Cited

U.S. PATENT DOCUMENTS

| | | | | |
|---|---|---|---|---|
| 6,276,949 | B1 | 8/2001 | Nakano et al. | |
| 12,461,124 | B2 * | 11/2025 | Miyaaki | G01R 1/06716 |
| 2004/0137767 | A1 * | 7/2004 | Suzuki | H01R 13/2421 439/73 |
| 2011/0171841 | A1 | 7/2011 | Tsubaki et al. | |
| 2012/0108108 | A1 | 5/2012 | Horikawa | |
| 2012/0242363 | A1 | 9/2012 | Breinlinger et al. | |
| 2012/0249174 | A1 | 10/2012 | Suzuki et al. | |
| 2013/0057308 | A1 | 3/2013 | Yano et al. | |
| 2015/0160265 | A1 | 6/2015 | Nakamura et al. | |
| 2016/0313371 | A1 | 10/2016 | Harada et al. | |
| 2017/0003010 | A1 * | 1/2017 | Mostoller | H01R 4/4821 |
| 2018/0238957 | A1 | 8/2018 | Nakamura et al. | |
| 2019/0052001 | A1 | 2/2019 | Consoli et al. | |
| 2019/0348786 | A1 | 11/2019 | Hachuda | |
| 2021/0072284 | A1 | 3/2021 | Suzuki et al. | |
| 2022/0029333 | A1 * | 1/2022 | Horning | H01R 12/7088 |
| 2022/0107359 | A1 | 4/2022 | Treibergs et al. | |
| 2023/0341436 | A1 * | 10/2023 | Arai | G01R 1/0483 |
| 2024/0094249 | A1 * | 3/2024 | Wu | G01R 3/00 |

FOREIGN PATENT DOCUMENTS

| | | | | | |
|---|---|---|---|---|---|
| JP | 2012-093127 | A | | 5/2012 | |
| JP | 2012099352 | A | | 5/2012 | |
| JP | 2014-146504 | A | | 8/2014 | |
| JP | 2017-146119 | A | | 8/2017 | |
| JP | 2019105785 | A | | 6/2019 | |
| JP | 2021-042974 | A | | 3/2021 | |
| KR | 20130004165 | A | | 1/2013 | |
| KR | 20180095315 | A | * | 8/2018 | G01R 1/06738 |
| TW | 499080 | U | | 8/2002 | |
| TW | 201312863 | A | | 3/2013 | |
| WO | WO-2023219322 | A1 | * | 11/2023 | |

OTHER PUBLICATIONS

Machine translation of WO-2023219322-A1 (Year: 2023).*
Extended European Search Report issued Dec. 7, 2023 in EP Application No. 23182944.1.
Office Action issued on Feb. 22, 2024, by the Taiwanese Patent Office in corresponding Taiwanese Patent Application No. 112125899. (4 pages).
Office Action issued on Jun. 18, 2024, in JP Application No. 2022111828, and English translation of the Office Action.

* cited by examiner

FIG. 25

| COMBINATION OF CONTACTS | CONTACT IN CONTACT WITH PACKAGE | COMPRESSION INTERLOCK MECHANISM |
|---|---|---|
| ONLY ELECTRICAL CONTACTS | ONLY ELECTRICAL CONTACTS | NOT REQUIRED |
| ELECTRICAL CONTACTS + THERMAL CONTACTS (SHORT) | ONLY ELECTRICAL CONTACTS | REQUIRED |
| ELECTRICAL CONTACTS + THERMAL CONTACTS (TALL) | ELECTRICAL CONTACTS + THERMAL CONTACTS | NOT REQUIRED |
| THERMAL CONTACTS (SHORT) + THERMAL CONTACTS (TALL) | THERMAL CONTACTS (TALL) | REQUIRED |
| ONLY THERMAL CONTACTS (SHORT) | THERMAL CONTACTS (SHORT) | NOT REQUIRED |
| ONLY THERMAL CONTACTS (TALL) | THERMAL CONTACTS (TALL) | NOT REQUIRED |

CONTACT PIN AND SOCKET FOR INSPECTION

CROSS-REFERENCE TO RELATED APPLICATIONS

This application claims foreign priority benefits under U.S.C. § 119 to Japanese Patent Application No. 2022-111828 filed on Jul. 12, 2022, the contents of which is hereby incorporated by reference in its entirety.

TECHNICAL FIELD

The present invention relates to a contact pin and a socket for inspection.

BACKGROUND ART

Peripheral type IC packages such as a Quad Flat Package (QFP) or a Quad Flat Non-leaded package (QFN) have grounding pads called Exposed Pad (E-Pad) provided at the center on the back surface. Contact pins may be electrically contacted to such E-Pads for grounding and/or thermally contacted to the E-Pads for heat dissipation.

Since such a contact pin is required to have good heat dissipation performance and electric conductive performance and, in addition, only a limited space is available for mounting the contact pin, probe type contact pins (for example, Patent Literature 1) have been conventionally employed.

CITATION LIST

Patent Literature

[PTL 1]
Japanese Patent Application Laid-Open No. 2021-42974

SUMMARY OF INVENTION

Technical Problem

However, since a probe type contact pin is formed of three or more components including a plunger, a barrel, and a coil spring, for example, and employs an internal contact system (a system in which the outer circumferential face of the plunger and the inner circumferential face of the barrel are contacted to each other), improvement on electrical performance and/or thermal performance is required.

Accordingly, the present invention intends to provide a contact pin and a socket for inspection that can improve the electrical performance and/or thermal performance.

Solution to Problem

To achieve the above object, the contact pin and the socket for inspection of the present invention employ the following solutions.

That is, a contact pin according to the first aspect of the present invention includes: a plurality of contacts having electrical conductivity, each of the contacts extending from a base end to a tip and having an elastic deformation part formed between the base end and the tip, and the elastic deformation part being elastically expandable and compressible in an extending direction; and at least one casing having electrical conductivity that bundles the plurality of contacts laterally stacked adjacent to each other, and the casing is in contact with the contacts so as to form a path bypassing the elastic deformation part.

According to the contact pin of the present aspect, since the electrically conductive casing that bundles a plurality of laterally stacked contacts is provided, and the casing is in contact with the contacts so as to form a path bypassing the elastic deformation part, it is possible to transfer electricity or heat from the base end to the portion on the tip side of the contacts while bypassing the elastic deformation part having complex structure. This can improve the electrical performance or thermal performance.

Further, the casing can improve handleability of the contacts.

Further, in the contact pin according to the second aspect of the present invention, the casing has the same electrical conductivity as or higher electrical conductivity than the contacts, in the contact pin according to the first aspect.

According to the contact pin of the present aspect, since the casing has the same electrical conductivity as or higher electrical conductivity than the contacts, the electrical performance can be further improved.

Further, the contact pin according to the third aspect of the present invention has two casings, and the casings are overlapped with each other to bundle the plurality of laterally stacked contacts, in the contact pin according to either the first aspect or the second aspect.

According to the contact pin of the present aspect, since two casings are provided and overlapped with each other to bundle the plurality of laterally stacked contacts, the area of the casings in contact with the contacts is increased, and thereby the electrical performance or thermal performance can be improved.

Further, in the contact pin according to the fourth aspect of the present invention, each of the casings has a stationary piece that is contacted to a contact located at one outermost face of the plurality of laterally stacked contacts and a movable piece that is elastically contacted to a contact located at the other outermost face of the plurality of laterally stacked contacts, in the contact pin according to the third aspect.

According to the contact pin of the present aspect, since the casing has a stationary piece that is contacted to the contact located at one outermost face of the plurality of laterally stacked contacts and a movable piece that is elastically contacted to the contact located at the other outermost face of the plurality of laterally stacked contacts, the casing can collectively, stably hold the contacts.

Further, in the contact pin according to the fifth aspect of the present invention, the casing has a movable piece that is elastically contacted to a contact located at one outermost face of the plurality of laterally stacked contacts and another movable piece that is elastically contacted to a contact located at the other outermost face of the plurality of laterally stacked contacts, in the contact pin according to the first aspect or the second aspect.

According to the contact pin of the present aspect, since the casing has a movable piece that is elastically contacted to the contact located at one outermost face and another movable piece that is elastically contacted to the contact located at the other outermost face, variation of the thickness of the laterally stacked contacts can be efficiently absorbed by the movable pieces that are elastically contacted from both the outer faces.

Further, in the contact pin according to the sixth aspect of the present invention, the casing has a first plate-like part and a second plate-like part that face each other and between which the laterally stacked contacts are arranged, the first plate-like part has a protrusion protruding toward the second plate-like part side, and the second plate-like part has a protrusion protruding toward the first plate-like part side, in the contact pin according to the first aspect or the second aspect.

According to the contact pin of the present aspect, since the first plate-like part has a protrusion protruding toward the second plate-like part side, and the second plate-like part has a protrusion protruding toward the first plate-like part side, a clearance can be provided between the casing and the contacts by the protrusions.

Further, the contact pin according to the seventh aspect of the present invention has two casings, and in a state where both the casings overlap with each other, the first plate-like part of one of the casings faces the second plate-like part side of the other of the casings, and the second plate-like part of each of the casings faces the laterally stacked contacts, in the contact pin according to the sixth aspect.

According to the contact pin of the present aspect, since two casings are provided and, in a state where both the casings overlap with each other, the first plate-like part of one of the casings faces the second plate-like part side of the other of the casings, and the second plate-like part of each of the casings faces the laterally stacked contacts, a clearance can be provided between the casing and the contact or between the casings by the protrusions.

Further, in the contact pin according to the eighth aspect of the present invention, a movable piece that is elastically contacted to the contact located at the outermost face is formed to the first plate-like part, in the contact pin according to the sixth aspect or the seventh aspect.

According to the contact pin of the present aspect, since a movable piece that is elastically contacted to the contact located at the outermost face is formed to the first plate-like part, the contacts can be collectively, stably held.

Further, in the contact pin according to the ninth aspect of the present invention, the casing has a stopper configured to restrict an amount of compression of the contact, in the contact pin according to any one of the first aspect to the eighth aspect.

According to the contact pin of the present aspect, since the casing has a stopper configured to restrict the amount of compression of the contact, it is possible to prevent the contact from being excessively compressed and damaged.

Further, in the contact pin according to the tenth aspect of the present invention, a protruding part protruding in the extending direction is formed on the base end of each of the plurality of contacts, in the contact pin according to any one of the first aspect to the ninth aspect.

According to the contact pin of the present aspect, since a protruding part protruding in the extending direction is formed on the base end of each of the plurality of contacts, the protruding part will be in contact with an IC package, and the contact pressure can be increased compared to a case of surface contact. This can improve the electrical performance of the contact pin.

Further, in the contact pin according to the eleventh aspect of the present invention, the base end of each of the plurality of contacts is formed planar, in the contact pin according to any one of the first aspect to the tenth aspect.

According to the contact pin of the present aspect, since the base end of each of the plurality of contacts is formed planar, the contact will be in contact with an IC package at a surface, and the contact area can be increased. This can improve the thermal performance of the contact pin.

Further, in the contact pin according to the twelfth aspect of the present invention, a protruding part protruding in the extending direction is formed on the base end of some of the contacts, the base end of the others of the contacts is formed planar, and the base end formed planar is at substantially the same height position as the protruding part, in the contact pin according to any one of the first aspect to the eleventh aspect.

According to the contact pin of the present aspect, a protruding part protruding in the extending direction is formed on the base end of some of the contacts, the base end of the others of the contacts is formed planar, and the base end formed planar is at substantially the same height position as the protruding part. Thus, contacts for different purposes can be combined into a single contact pin, for example, the contacts having the protruding part formed on the base end may be used for electrical contact, while the contacts having the planarly formed base end may be used for thermal contact.

Further, a socket for inspection according to the thirteenth aspect of the present invention includes contact pins according to any one of the first aspect to the twelfth aspect; and a housing configured to accommodate the contact pins.

Further, in the socket for inspection according to the fourteenth aspect of the present invention, the housing has an upper housing and a lower housing that define a space in which the elastic deformation parts of the contact pins are accommodated, and the contact pins are configured such that the elastic deformation parts are compressed by the upper housing and the lower housing, in the socket for inspection according to the thirteenth aspect.

Advantageous Effects of Invention

According to the present invention, the electrical performance or thermal performance can be improved.

BRIEF DESCRIPTION OF DRAWINGS

FIG. 4 is a longitudinal sectional view of the socket for inspection in a state where a movable housing has been pushed in.

FIG. 25 is a table illustrating an example of combinations of the contacts.

DESCRIPTION OF EMBODIMENTS

Figure 1:
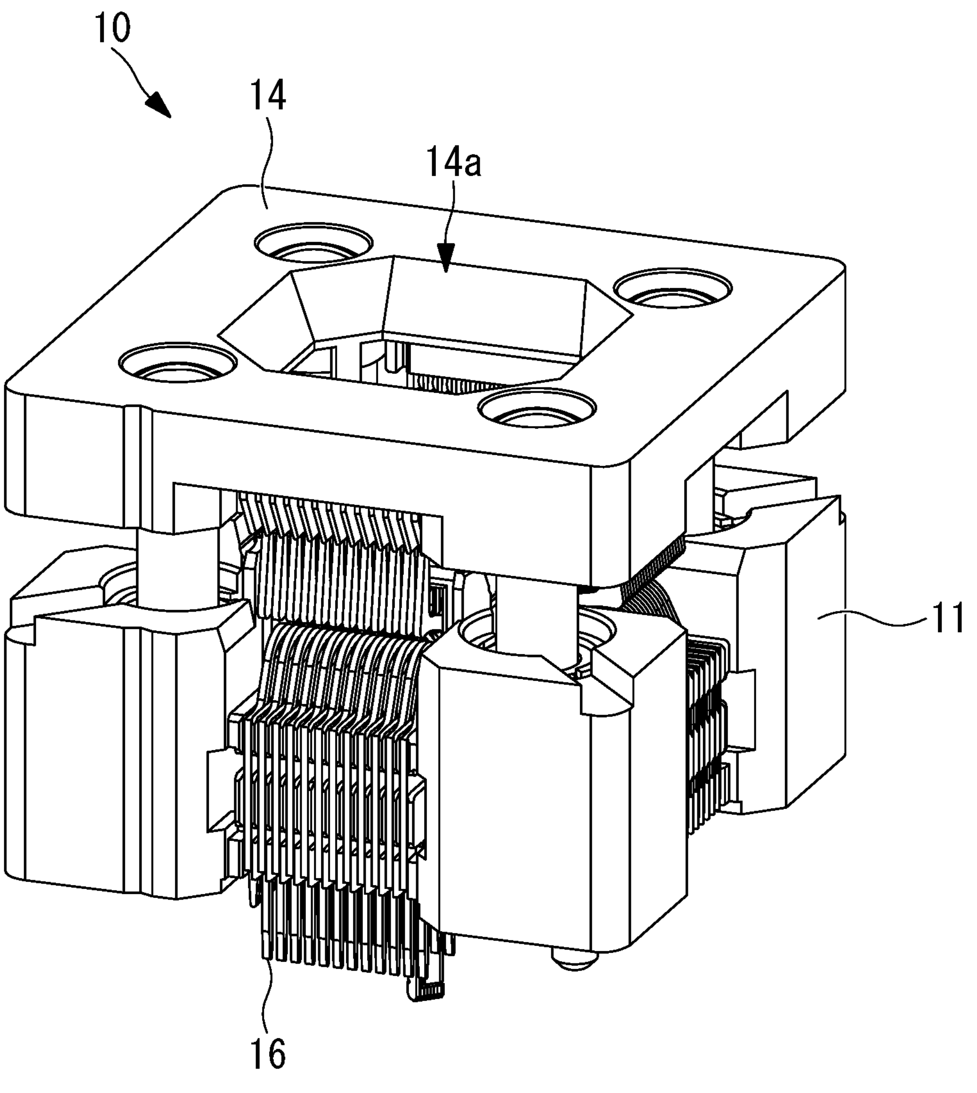
FIG. 1 is a perspective view of a socket for inspection.
Figure 2:
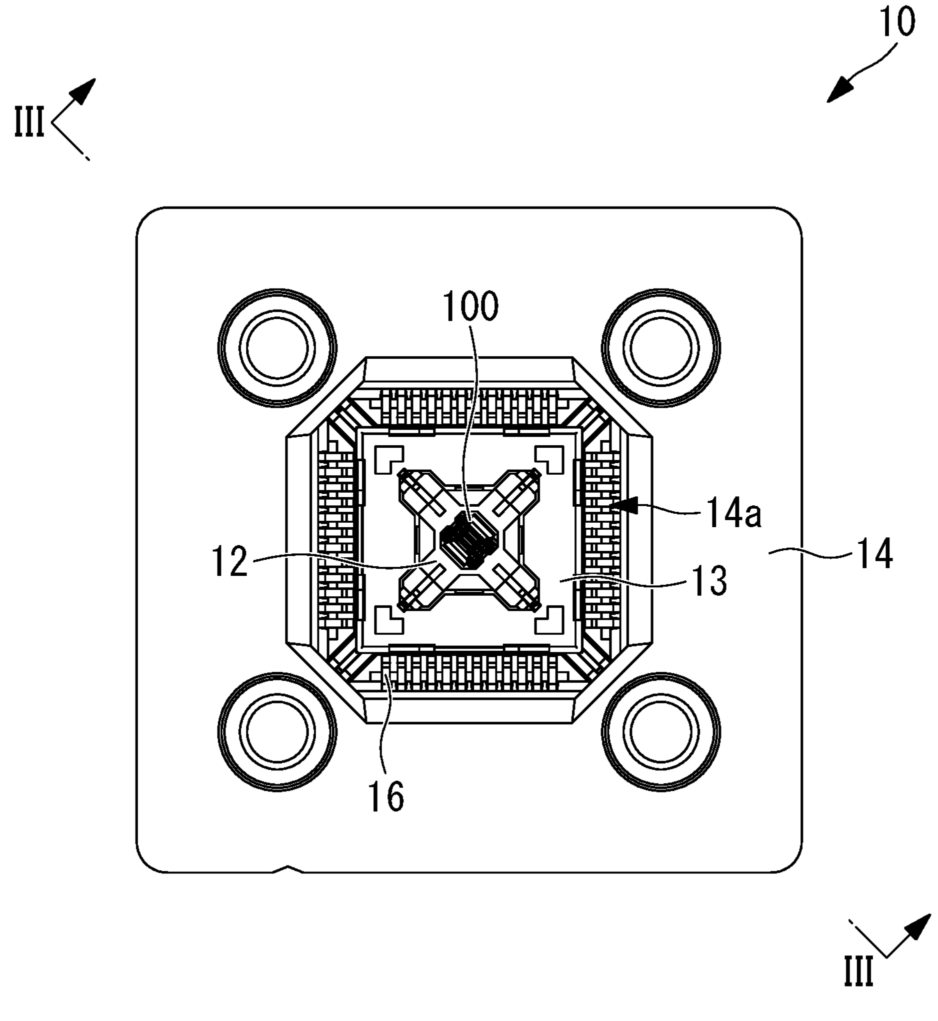
FIG. 2 is a plan view of the socket for inspection.

A contact pin and a socket for inspection according to one embodiment of the present invention will be described below with reference to the drawings.

[Configuration of Socket for Inspection]

A socket for inspection 10 is a device for electrically connecting an IC package 20 and a printed wiring board (inspection board) to each other.

The IC package 20 is of the peripheral type such as a QFP or a QFN, for example.

As illustrated in FIG. 1 to FIG. 5, the socket for inspection 10 as an example has a lower housing 11, an upper housing 12, a stage 13, a movable housing 14, and a contact pin 100.

The lower housing 11 is a component placed on an inspection board (not illustrated) and serves as a base of the socket for inspection 10.

As illustrated in FIG. 1 and FIG. 3 to FIG. 5, a lower recess 11*a* and a lower through hole 11*b* are formed inside the lower housing 11.

The lower recess 11*a* is a portion in which a part of the contact pin 100 is accommodated and is a hollow having an opening facing the upper housing 12.

The lower through hole 11*b* is a through hole extending downward from the bottom of the lower recess 11*a* and reaching the outside of the lower housing 11.

The upper housing 12 is a component installed from above the lower housing 11. The upper housing 12 is configured to be able to vertically move closer to or away from the lower housing 11. Note that the upper housing 12 is pushed upward by a pushing member (not illustrated), thus is most distant from the lower housing 11 when no load is applied (see FIG. 3 and FIG. 5), and comes closer to the lower housing 11 by being pushed downward (see FIG. 4).

An upper recess 12*a* and an upper through hole 12*b* are formed inside the upper housing 12.

The upper recess 12*a* is a portion in which the contact pin 100 described later is accommodated and is a hollow having an opening facing the lower housing 11.

The upper through hole 12*b* is a through hole extending upward from the top surface of the upper recess 12*a* and reaching the outside of the upper housing 12.

The stage 13 is a component on which the IC package 20 is placed, and the stage 13 is installed above the upper housing 12.

The stage 13 is fixed to the lower housing 11.

The movable housing 14 is a component installed above the stage 13. The movable housing 14 is configured to be able to vertically move closer to or away from the lower housing 11. Note that the movable housing 14 is pushed upward by a pushing member (not illustrated), thus is most distant from the lower housing 11 when no load is applied (see FIG. 3 and FIG. 5), and comes closer to the lower housing 11 by being pushed downward (see FIG. 4).

As illustrated in FIG. 1 to FIG. 5, a package accommodating part 14*a* is formed in the movable housing 14.

The package accommodating part 14*a* is an opening that enables access to the stage 13 from above.

Figure 5:
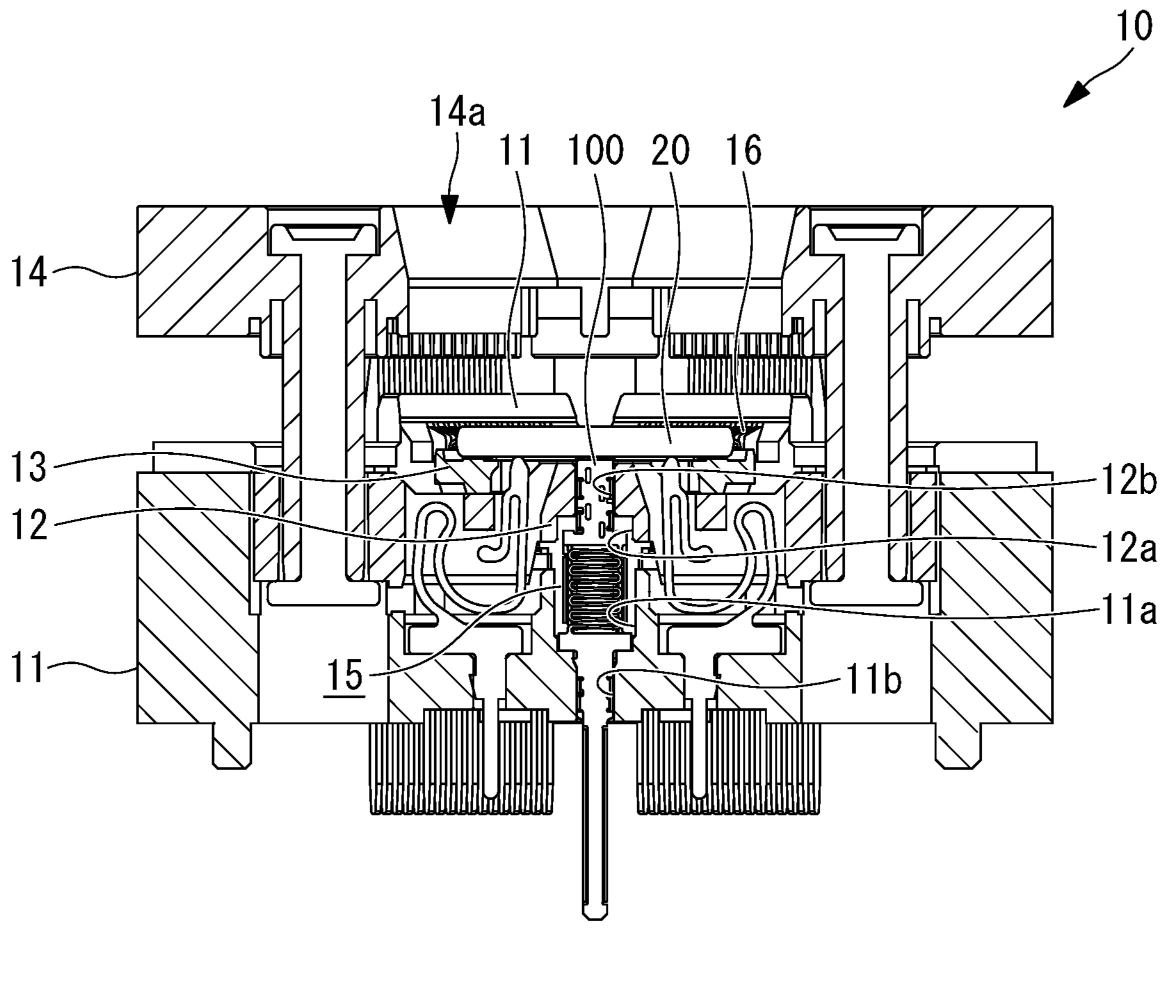
FIG. 5 is a longitudinal sectional view of the socket for inspection in a state where an IC package has been placed on a stage and the movable housing has been moved back to the original position.

As illustrated in FIG. 5, the contact pin 100 is a component that is thermally and/or electrically contacted to a pad (E-Pad) provided at the center on the back surface of the IC package 20.

Figure 3:
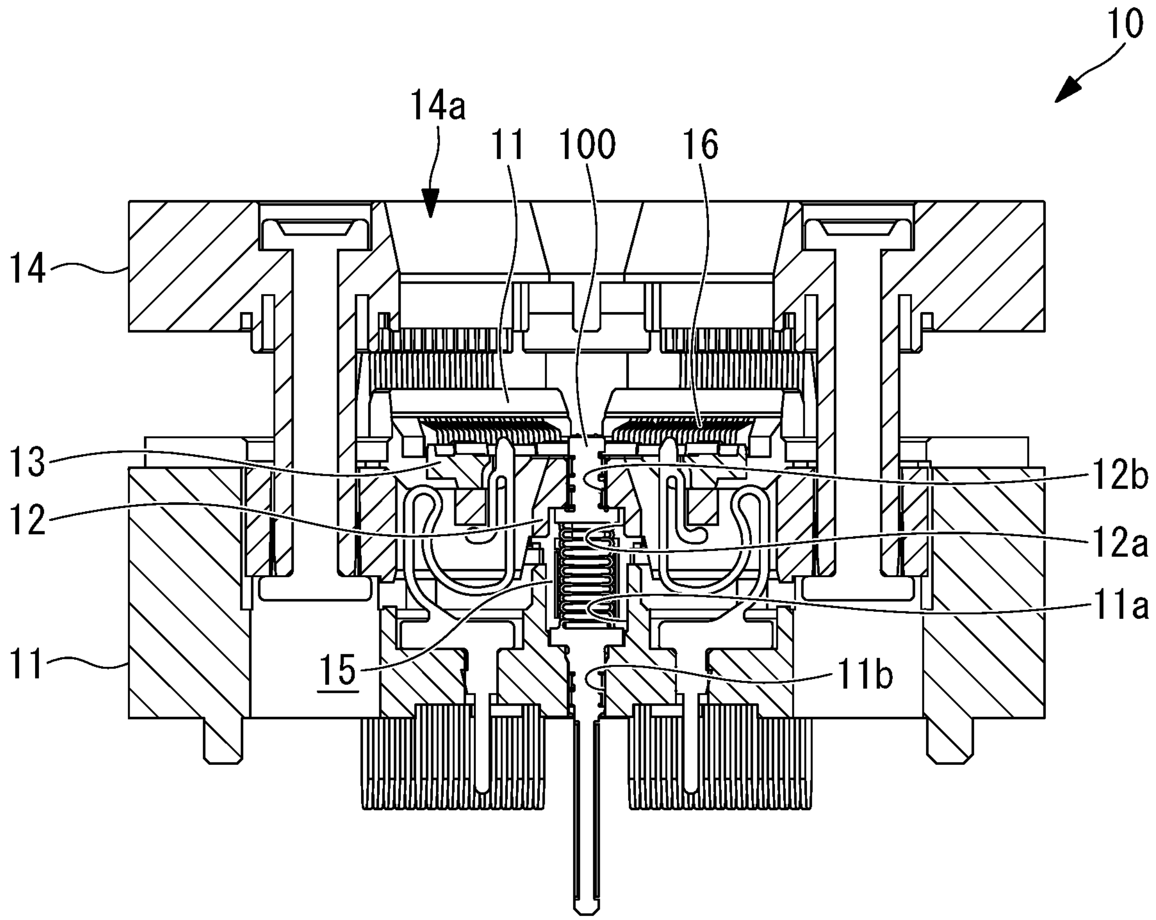
FIG. 3 is a longitudinal sectional view taken along the cut line III-III illustrated in FIG. 2.

As illustrated in FIG. 3, the contact pin 100 is provided to the socket for inspection 10 in a state where the middle portion of the contact pin 100 is accommodated and held in an accommodating space 15 defined by the lower recess 11*a* and the upper recess 12*a* and the tip portion of the contact pin 100 protrudes out of the lower through hole 11*b* and in a state where the base end portion of the contact pin 100 protrudes out of the upper through hole 12*b*.

The detailed configuration of the contact pin 100 will be described later.

As illustrated in FIG. 1 to FIG. 5, a number of peripheral contact pins 16 held by the lower housing 11 are arranged around the stage 13.

Figure 4:
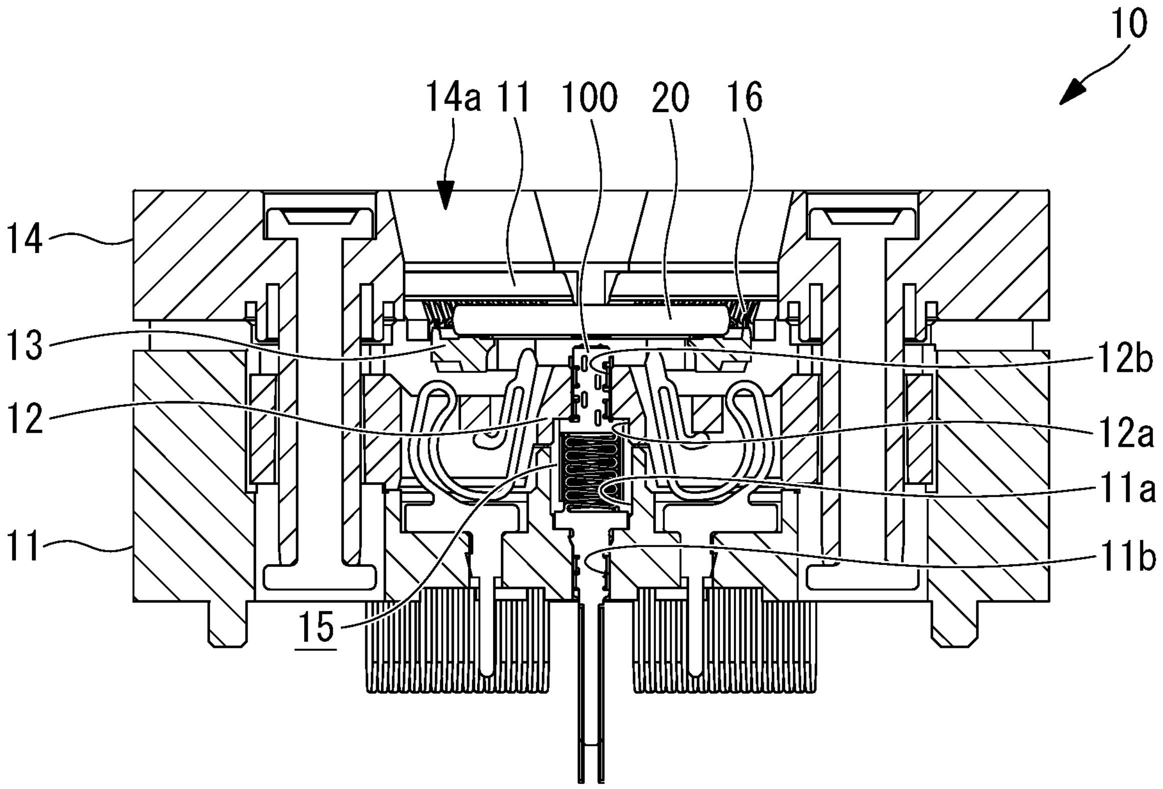

The tips (upper ends) of the peripheral contact pins 16 are configured such that, when the movable housing 14 is pushed into the lower housing 11 side, the tips are moved outward away from the circumferential edge of the stage 13 and accommodated in the circumferential wall of the lower housing 11 (see FIG. 4). Further, the tips of the peripheral contact pins 16 are configured such that, when the movable housing 14 is moved back to the original position, the tips come close to the circumferential edge of the stage 13 and protrude from the circumferential wall of the lower housing 11 (see FIG. 3 and FIG. 5).

Before the IC package 20 is placed on the socket for inspection 10, first, the movable housing 14 is pushed into the lower housing 11 side to separate the tip of each peripheral contact pin 16 from the circumferential edge of the stage 13, as illustrated in FIG. 4. Accordingly, a width through which the IC package 20 can be accepted is ensured above the stage 13.

Further, when the movable housing 14 is pushed into, the upper housing 12 is also pushed into the lower housing 11 side. In response, the accommodating space 15 in which the middle portion of the contact pin 100 is accommodated are vertically reduced in volume.

At this time, the contact pin 100 (in detail, elastic deformation parts 112, 122 described later) is compressed in accordance with the reduction of the accommodating space 15.

Next, as illustrated in FIG. 5, after the IC package 20 is placed on the stage 13, the movable housing 14 is moved back to the original position.

At this time, since the tip of each peripheral contact pins 16 is also moved back to the original position, the tip of each peripheral contact pin 16 is contacted to a lead wire extending from the circumferential edge of the IC package 20. Further, at the same time, the IC package 20 is pushed against the stage 13.

Further, when the movable housing 14 has moved back to the original position, the upper housing 12 has also moved back to the original position. In response, the accommodating space 15 in which the middle portion of the contact pin 100 is accommodated expands vertically (back to the original state).

Since the IC package 20 is installed on the stage 13, however, the contact pin 100 (in detail, elastic deformation parts 112, 122 described later) maintains the state compressed by the IC package 20.

Note that the contact pin 100 is obviously also applicable to other forms of sockets for inspection than the socket for inspection 10 described above.

Herein, other forms of sockets for inspection are, for example, sockets for inspection having a form in which the probe type contact pin as a peripheral contact pin is located below the IC package 20 and, when the IC package 20 is pushed from above by a latch or a pusher, the contact pin 100 and the peripheral contact pin come into contact with terminals or lead wires of the IC package 20.

[Details of Contact Pin]

Figure 6:
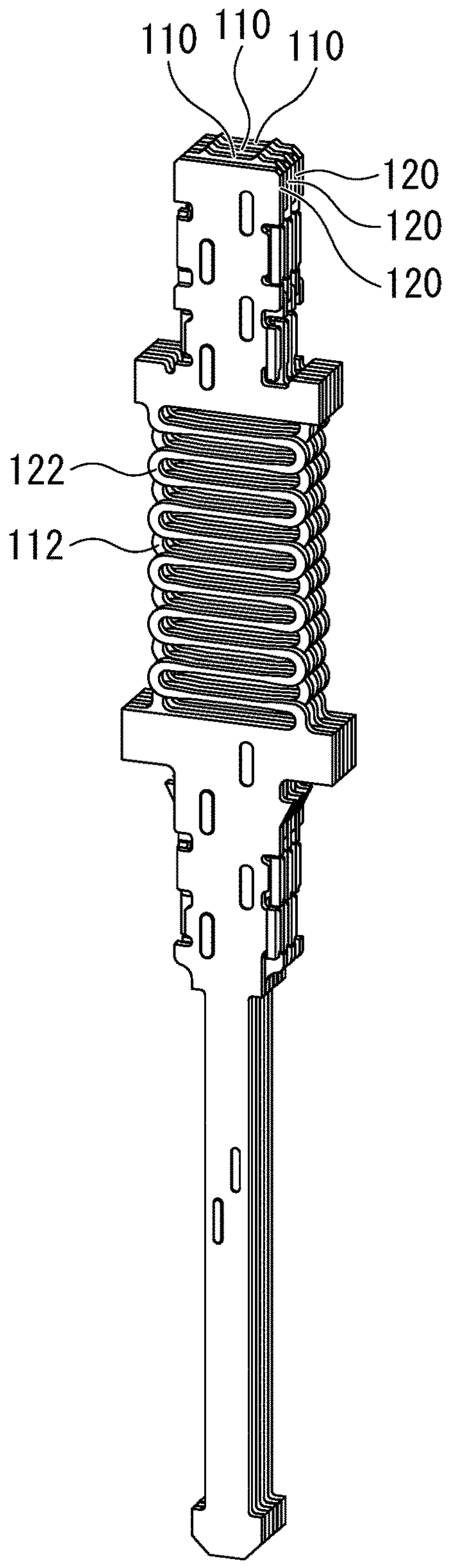
FIG. 6 is a perspective view in a state where electrical contacts and thermal contacts are laterally stacked.

As illustrated in FIG. 6, the contact pin 100 has electrical contacts (contacts) 110 and thermal contacts (contacts) 120, for example, which are alternatingly, laterally stacked to form the contact pin 100.

Figure 7:
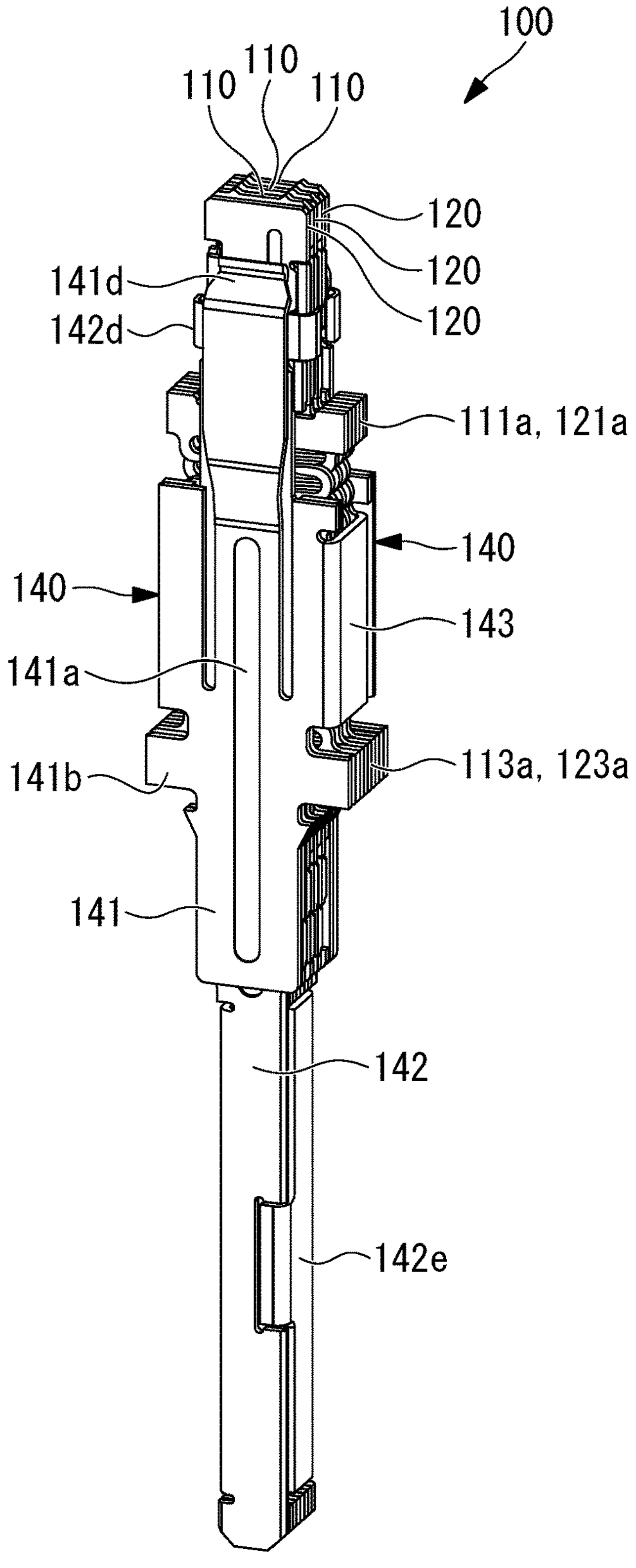
FIG. 7 is a perspective view of the contact pin.

Further, as illustrated in FIG. 7, the contact pin 100 may have a casing 140 that bundles the electrical contacts 110 and the thermal contacts 120.

Note that the terms of "electrical" and "thermal" are used for convenience in order to distinguish the types of contacts from each other and are not intended to limit the use thereof.

<Electrical Contact>

Figure 8:
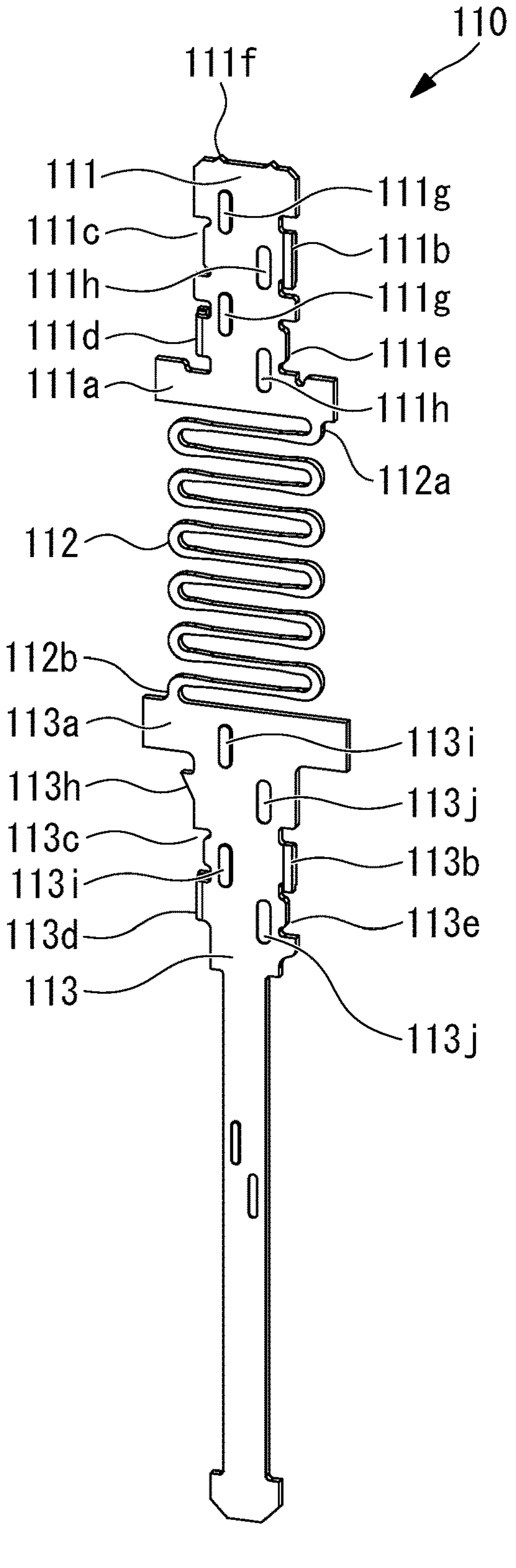
FIG. 8 is a perspective view of the electrical contact.

As illustrated in FIG. 8, each electrical contact 110 is a thin plate-like component extending in a predetermined direction (the vertical direction in FIG. 8).

The electrical contact 110 mainly has a function of conducting electricity in the contact pin 100 (electrical contacting).

The electrical contact 110 has electrical conductivity and is formed such that Ni plating as an undercoat is applied to a substrate of a Cu based material (for example, beryllium copper), and plating whose main component is an Au based material is applied to the surface of the Ni layer. Note that these materials are mere examples.

The electrical contact 110 has a base end side plate-like part 111 located on the upper end side, an elastic deformation part 112 located at the middle, and a tip side plate-like part 113 located on the lower end side.

The base end side plate-like part 111 is a portion that is contacted to the IC package 20.

A rectangular wider part 111*a* is formed in the lower part of the base end side plate-like part 111, and the external shape thereof is substantially an inverse-T shape.

An upper claw 111*b*, an upper notch 111*c*, a lower claw 111*d*, a lower notch 111*e*, and contact protruding parts 111*f* are formed in the portion of the base end side plate-like part 111 above the wider part 111*a*.

The upper claw 111*b* is a portion having a shape such that a part of a first side face of the base end side plate-like part 111 is bent in a direction orthogonal to the extending direction of the electrical contact 110. In the case of FIG. 8, a part of the right face of the base end side plate-like part 111 is bent to the front, and thereby the upper claw 111*b* is formed.

The upper notch 111*c* is a portion having a shape such that a second side face of the base end side plate-like part 111 is partially notched. In the case of FIG. 8, the left face of the base end side plate-like part 111 is partially notched, and thereby the upper notch 111*c* is formed.

The upper notch 111*c* is formed at substantially the same height position as that of the upper claw 111*b*.

The lower claw 111*d* is a portion having a shape such that a part of the second side face of the base end side plate-like part 111 is bent to a direction orthogonal to the extending direction of the electrical contact 110 and a direction opposite to the upper claw 111*b*. In the case of FIG. 8, a part of the left face of the base end side plate-like part 111 is bent to the backside, and thereby the lower claw 111*d* is formed.

The lower claw 111*d* is formed below the upper notch 111*c*.

The lower notch 111*e* is a portion having a shape such that the first side face of the base end side plate-like part 111 is partially notched. In the case of FIG. 8, the right face of the base end side plate-like part 111 is partially notched, and thereby the lower notch 111*e* is formed.

The lower notch 111*e* is formed at substantially the same height position as that of the lower claw 111*d*.

The contact protruding parts 111*f* are portions protruding in the extending direction of the electrical contact 110 from the top face of the base end side plate-like part 111. In FIG. 8, substantially triangular two contact protruding parts 111*f* are formed on the top face of the base end side plate-like part 111.

The contact protruding parts 111*f* have a function of physically contacting the IC package 20 in the electrical contact 110.

Although the shape of the contact protruding part 111*f* or the number of contact protruding parts 111*f* is not limited to that in the form of FIG. 8, it is preferable to form the contact protruding parts 111*f* so as to have a small contact area with the IC package 20 in terms of increasing the contact pressure and ensuring the contact reliability.

Protrusions 111*g* and protrusions 111*h* are formed arranged in a staggered manner on the surface of the base end side plate-like part 111.

Each of the protrusions 111*g* is a portion protruding in the plate thickness direction from the surface of the base end side plate-like part 111. The protruding amount of the protrusion 111*g* is smaller than the plate thickness of the electrical contact 110. The protrusion 111*g* is a part that is contacted to the surface of the base end side plate-like part 121 of the adjacent thermal contact 120.

Each of the protrusions 111*h* is a portion protruding in the plate thickness direction and the direction opposite to the protrusions 111*g* from the surface of the base end side plate-like part 111. The protruding amount of the protrusion 111*h* is substantially the same as that of the protrusion 111*g*. The protrusion 111*h* is a part that is contacted to the surface of the base end side plate-like part 121 of the adjacent thermal contact 120. Note that the thermal contact 120 to which the protrusions 111_h_ is contacted is different from the thermal contact 120 to which the protrusions 111_g_ is contacted.

In the case of FIG. 8, although the protrusions 111_g_ protrude on the front side and the protrusions 111_h_ protrude on the backside, these protrusion directions are mere examples.

The elastic deformation part 112 is an elastically expandable or compressible portion. In the case of FIG. 8, the elastic deformation part 112 is a bellows-like plate spring having an upper end 112_a_ connected to the bottom face of the wider part 111_a_ of the base end side plate-like part 111 and a lower end 112_b_ connected to the tip side plate-like part 113 (in detail, the top face of the wider part 113_a_ of the tip side plate-like part 113).

Note that the shape of the elastic deformation part 112 is not limited to a bellows-like plate spring.

The tip side plate-like part 113 is a portion that is contacted to an inspection board.

A rectangular wider part 113_a_ is formed in the upper part of the tip side plate-like part 113, and the external shape thereof is substantially a T shape.

An upper claw 113_b_, an upper notch 113_c_, a lower claw 113_d_, a lower notch 113_e_, and a press-fit claw 113_h_ are formed in a portion of the tip side plate-like part 113 below the wider part 113_a_.

The upper claw 113_b_ is a portion having a shape such that a part of a first side face of the tip side plate-like part 113 is bent in a direction orthogonal to the extending direction of the electrical contact 110. In the case of FIG. 8, a part of the right face of the tip side plate-like part 113 is bent to the front, and thereby the upper claw 113_b_ is formed.

The upper notch 113_c_ is a portion having a shape such that a second side face of the tip side plate-like part 113 is partially notched. In the case of FIG. 8, the left face of the tip side plate-like part 113 is partially notched, and thereby the upper notch 113_c_ is formed.

The upper notch 113_c_ is formed at substantially the same height position as that of the upper claw 113_b_.

The lower claw 113_d_ is a portion having a shape such that a part of the second side face of the tip side plate-like part 113 is bent to a direction orthogonal to the extending direction of the electrical contact 110 and a direction opposite to the upper claw 113_b_. In the case of FIG. 8, a part of the left face of the tip side plate-like part 113 is bent to the backside, and thereby the lower claw 113_d_ is formed.

The lower claw 113_d_ is formed below the upper notch 113_c_.

The lower notch 113_e_ is a portion having a shape such that the first side face of the tip side plate-like part 113 is partially notched. In the case of FIG. 8, the right face of the tip side plate-like part 113 is partially notched, and thereby the lower notch 113_e_ is formed.

The lower notch 113_e_ is formed at substantially the same height position as that of the lower claw 113_d_.

The press-fit claw 113_h_ is a protrusion formed in at least one of the first side face and the second side face of the tip side plate-like part 113 below the wider part 113_a_ and above the upper notch 113_c_. Note that the press-fit claw 113_h_ may be formed below the upper notch 113_c_ in accordance with the space.

The press-fit claw 113_h_ has a function of locking the electrical contact 110 to the lower housing 11. Note that, when it is not required to lock the electrical contact 110 to the lower housing 11, the press-fit claw 113_h_ may be omitted.

Protrusions 113_i_ and protrusions 113_j_ are formed arranged in a staggered manner on the surface of the tip side plate-like part 113.

Each of the protrusions 113_i_ is a portion protruding in the plate thickness direction from the surface of the tip side plate-like part 113. The protruding amount of the protrusion 113_i_ is smaller than the plate thickness of the electrical contact 110 and substantially the same as that of the protrusion 111_g_ of the base end side plate-like part 111. The protrusion 113_i_ is a part that is contacted to the surface of the tip side plate-like part 123 of the adjacent thermal contact 120.

Each of the protrusions 113_j_ is a portion protruding in the plate thickness direction and the direction opposite to the protrusions 113_i_ from the surface of the tip side plate-like part 113. The protruding amount of the protrusion 113_j_ is substantially the same as that of the protrusion 113_i_. The protrusion 113_j_ is a part that is contacted to the surface of the tip side plate-like part 123 of the adjacent thermal contact 120. Note that the thermal contact 120 to which the protrusions 113_j_ is contacted is different from the thermal contact 120 to which the protrusions 113_i_ is contacted.

In the case of FIG. 8, although the protrusions 113_i_ protrude on the front side and the protrusions 113_j_ protrude on the backside, these protrusion directions are mere examples.

The electrical contact 110 is molded by, for example, press machining from a plate material that becomes the substrate.

Accordingly, a large number of electrical contacts 110 can be produced with high accuracy and with suppressed variation among products.

<Thermal Contact>

Figure 9:
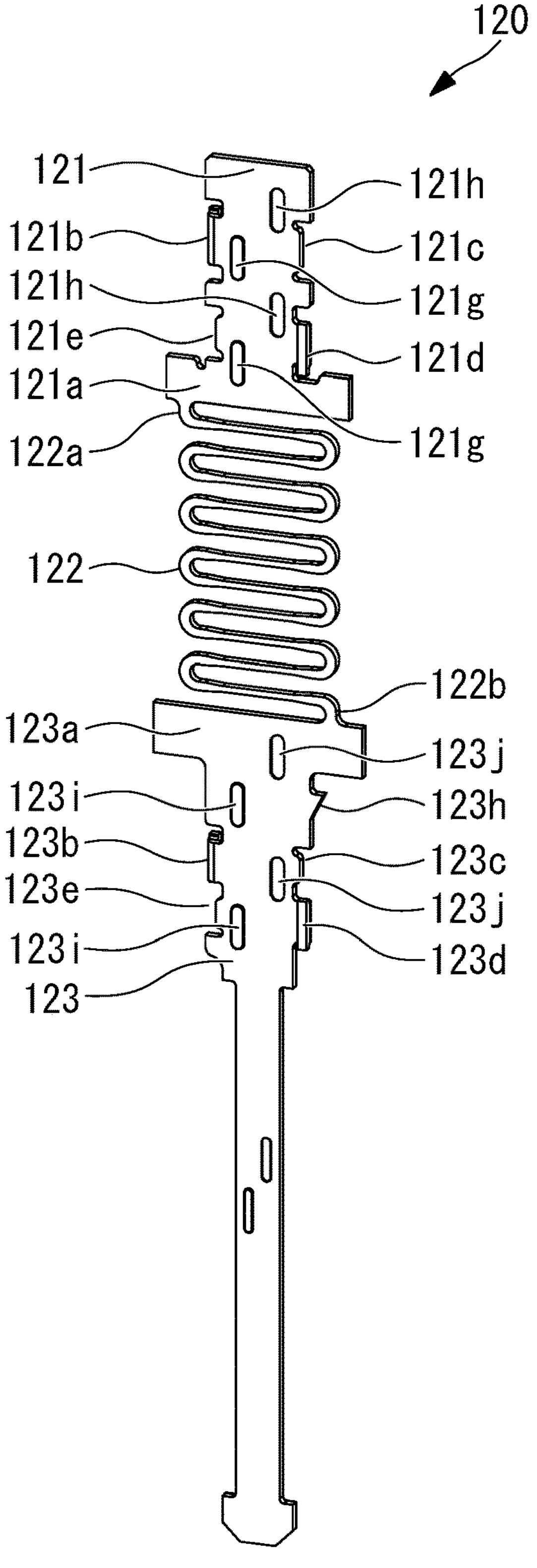
FIG. 9 is a perspective view of the thermal contact.

As illustrated in FIG. 9, each thermal contact 120 is a thin plate-like component extending in a predetermined direction (the vertical direction in FIG. 9). The external shape of the thermal contact 120 substantially matches the external shape of the turned-over electrical contact 110 except for the upper part of the base end side plate-like part 121.

The thermal contact 120 mainly has a function of transferring heat in the contact pin 100 (thermal contacting).

The thermal contact 120 has electrical conductivity and is formed such that Ni plating as an undercoat is applied to a substrate of a Cu based material (for example, beryllium copper), and plating whose main component is an Au based material is applied to the surface of the Ni layer. Note that these materials are mere examples.

The thermal contact 120 has the base end side plate-like part 121 located on the upper end side, an elastic deformation part 122 located at the middle, and a tip side plate-like part 123 located on the lower end side.

The base end side plate-like part 121 is a portion that is contacted to the IC package 20.

A rectangular wider part 121_a_ is formed in the lower part of the base end side plate-like part 121, and the external shape thereof is substantially an inverse-T shape.

An upper claw 121_b_, an upper notch 121_c_, a lower claw 121_d_, and a lower notch 121_e_ are formed in the portion of the base end side plate-like part 121 above the wider part 121_a_.

The upper claw 121_b_ is a portion having a shape such that a part of a first side face of the base end side plate-like part 121 is bent in a direction orthogonal to the extending direction of the thermal contact 120. In the case of FIG. 9, a part of the left face of the base end side plate-like part 121 is bent to the backside, and thereby the upper claw 121_b_ is formed.

The upper notch 121*c* is a portion having a shape such that a second side face of the base end side plate-like part 121 is partially notched. In the case of FIG. 9, the right face of the base end side plate-like part 121 is partially notched, and thereby the upper notch 121*c* is formed.

The upper notch 121*c* is formed at substantially the same height position as that of the upper claw 121*b*.

The lower claw 121*d* is a portion having a shape such that a part of the second side face of the base end side plate-like part 121 is bent to a direction orthogonal to the extending direction of the thermal contact 120 and a direction opposite to the upper claw 121*b*. In the case of FIG. 9, a part of the right face of the base end side plate-like part 121 is bent to the front, and thereby the lower claw 121*d* is formed.

The lower claw 121*d* is formed below the upper notch 121*c*.

The lower notch 121*e* is a portion having a shape such that the first side face of the base end side plate-like part 121 is partially notched. In the case of FIG. 9, the left face of the base end side plate-like part 121 is partially notched, and thereby the lower notch 121*e* is formed.

The lower notch 121*e* is formed at substantially the same height position as that of the lower claw 121*d*.

Note that no portion corresponding to the contact protruding part 111*f* is formed on the top face of the base end side plate-like part 121. That is, the top face of the base end side plate-like part 121 is formed planar.

A plurality of protrusions 121*g* and a plurality of protrusions 121*h* are formed arranged in a staggered manner on the surface of the base end side plate-like part 121.

Each of the protrusions 121*g* is a portion protruding in the plate thickness direction from the surface of the base end side plate-like part 121. The protruding amount of the protrusion 121*g* is smaller than the plate thickness of the thermal contact 120. The protrusion 121*g* is a part that is contacted to the surface of the base end side plate-like part 111 of the adjacent electrical contact 110.

Each of the protrusions 121*h* is a portion protruding in the plate thickness direction and the direction opposite to the protrusions 121*g* from the surface of the base end side plate-like part 121. The protruding amount of the protrusion 121*h* is substantially the same as that of the protrusion 121*g*. The protrusion 121*h* is a part that is contacted to the surface of the base end side plate-like part 111 of the adjacent electrical contact 110. Note that the electrical contact 110 to which the protrusions 121*h* is contacted is different from the electrical contact 110 to which the protrusions 121*g* is contacted.

In the case of FIG. 9, although the protrusions 121*g* protrude on the front side and the protrusions 121*h* protrude on the backside, these protrusion directions are mere examples.

Note that the shape of each protrusion, the number of protrusions, and the arrangement of the protrusions are not limited to the depicted form.

The elastic deformation part 122 is an elastically expandable or compressible portion. In the case of FIG. 9, the elastic deformation part 122 is a bellows-like plate spring having an upper end 122*a* connected to the bottom face of the wider part 121*a* of the base end side plate-like part 121 and a lower end 122*b* connected to the tip side plate-like part 123 (in detail, the top face of the wider part 123*a* of the tip side plate-like part 123).

Note that the shape of the elastic deformation part 122 is not limited to a bellows-shaped plate spring.

The tip side plate-like part 123 is a portion that is contacted to an inspection board.

A rectangular wider part 123*a* is formed in the upper part of the tip side plate-like part 123, and the external shape thereof is substantially a T shape.

An upper claw 123*b*, an upper notch 123*c*, a lower claw 123*d*, a lower notch 123*e*, and a press-fit claw 123*h* are formed in a portion of the tip side plate-like part 123 below the wider part 123*a*.

The upper claw 123*b* is a portion having a shape such that a part of a first side face of the tip side plate-like part 123 is bent in a direction orthogonal to the extending direction of the thermal contact 120. In the case of FIG. 9, a part of the left face of the tip side plate-like part 123 is bent to the backside, and thereby the upper claw 123*b* is formed.

The upper notch 123*c* is a portion having a shape such that a second side face of the tip side plate-like part 123 is partially notched. In the case of FIG. 9, the right face of the tip side plate-like part 123 is partially notched, and thereby the upper notch 123*c* is formed.

The upper notch 123*c* is formed at substantially the same height position as that of the upper claw 123*b*.

The lower claw 123*d* is a portion having a shape such that a part of the second side face of the tip side plate-like part 123 is bent to a direction orthogonal to the extending direction of the thermal contact 120 and a direction opposite to the upper claw 123*b*. In the case of FIG. 9, a part of the right face of the tip side plate-like part 123 is bent to the front, and thereby the lower claw 123*d* is formed.

The lower claw 123*d* is formed below the upper notch 123*c*.

The lower notch 123*e* is a portion having a shape such that the first side face of the tip side plate-like part 123 is partially notched. In the case of FIG. 9, the left face of the tip side plate-like part 123 is partially notched, and thereby the lower notch 123*e* is formed.

The lower notch 123*e* is formed at substantially the same height position as that of the lower claw 123*d*.

The press-fit claw 123*h* is a protrusion formed in at least one of the first side face and the second side face of the tip side plate-like part 123 below the wider part 123*a* and above the upper notch 123*c*. Note that the press-fit claw 123*h* may be formed below the upper notch 123*c* in accordance with the space.

The press-fit claw 123*h* has a function of locking the thermal contact 120 to the lower housing 11. Note that, when it is not required to lock the thermal contact 120 to the lower housing 11, the press-fit claw 123*h* may be omitted.

A plurality of protrusions 123*i* and a plurality of protrusions 123*j* are formed arranged in a staggered manner on the surface of the tip side plate-like part 123.

Each of the protrusions 123*i* is a portion protruding in the plate thickness direction from the surface of the tip side plate-like part 123. The protruding amount of the protrusion 123*i* is smaller than the plate thickness of the thermal contact 120 and substantially the same as that of the protrusion 121*g* of the base end side plate-like part 121. The protrusion 123*i* is a part that is contacted to the surface of the tip side plate-like part 113 of the adjacent electrical contact 110.

Each of the protrusions 123*j* is a portion protruding in the plate thickness direction and the direction opposite to the protrusions 123*i* from the surface of the tip side plate-like part 123. The protruding amount of the protrusion 123*j* is substantially the same as that of the protrusion 123*i*. The protrusion 123*j* is a part that is contacted to the surface of the tip side plate-like part 113 of the adjacent electrical contact 110. Note that the electrical contact 110 to which the protrusions 123*j* is contacted is different from the electrical contact 110 to which the protrusions 123*i* is contacted.

In the case of FIG. 9, although the protrusions 123*i* protrude on the front side and the protrusions 123*j* protrude on the backside, these protrusion directions are mere examples.

Note that the shape of each protrusion, the number of protrusions, and the arrangement of the protrusions are not limited to the depicted form.

The thermal contact 120 is molded by, for example, press machining from a plate material that becomes the substrate.

Accordingly, a large number of thermal contacts 120 can be produced with high accuracy and with suppressed variation among products.

The thermal contact 130 described later also has the same configuration as the thermal contact 120 except for the dimension (the height position of the upper end) of the base end side plate-like part 131.

<Interlocking Mechanism>

Figure 10:
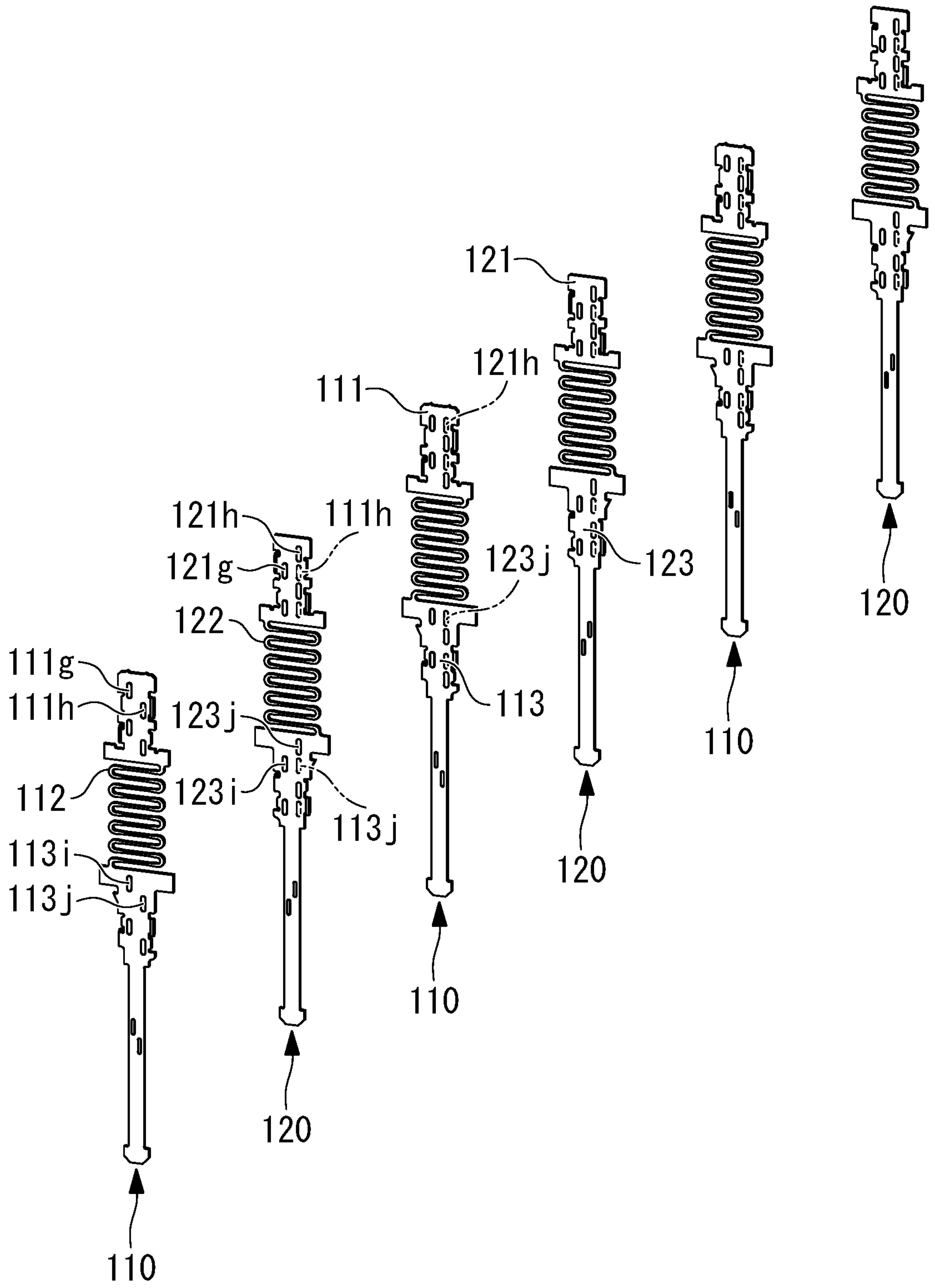
FIG. 10 is a perspective view of a state where electrical contacts and thermal contacts are aligned (state before laterally stacked).

The electrical contacts 110 and the thermal contacts 120 configured as described above are aligned alternatingly in the plate thickness direction as illustrated in FIG. 10 and laterally stacked as illustrated in FIG. 6.

Figure 11:
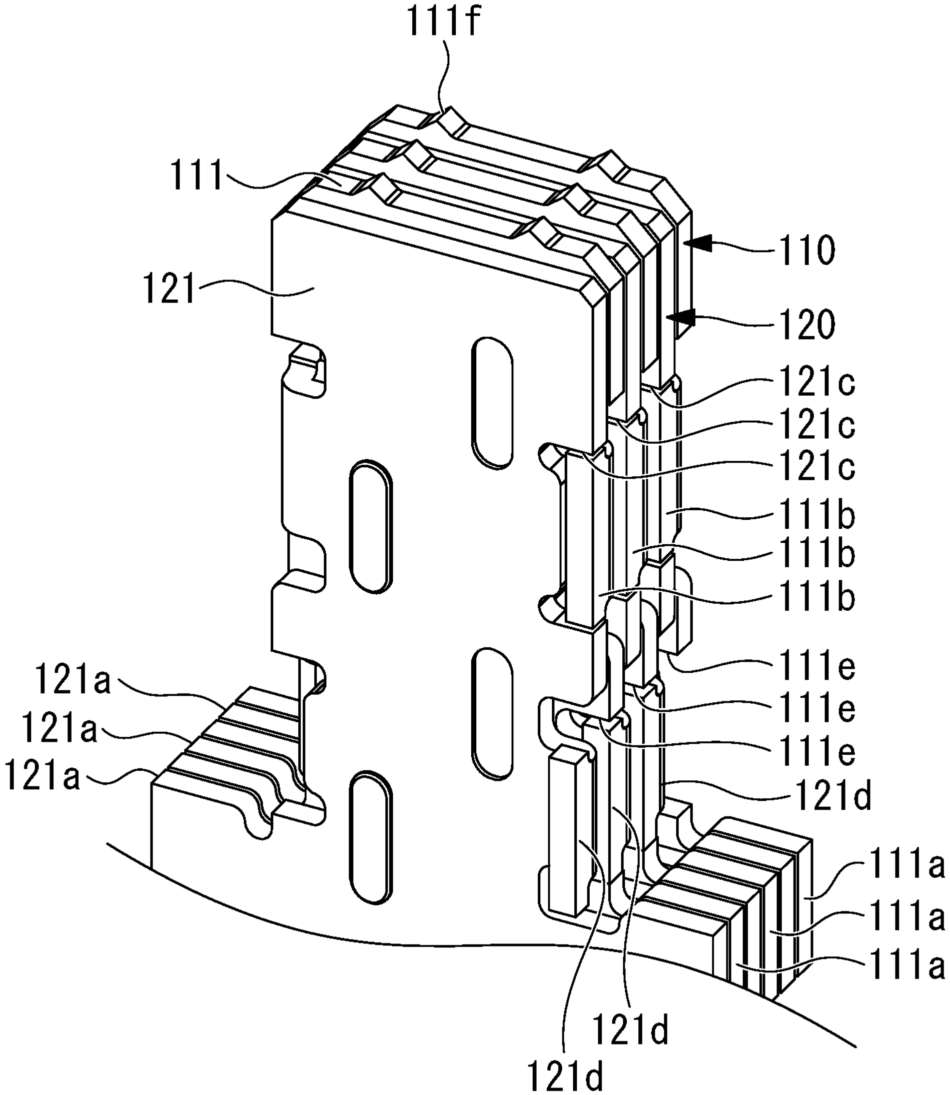
FIG. 11 is a top-right perspective view of a base end portion of the laterally stacked electrical contacts and thermal contacts.
Figure 12:
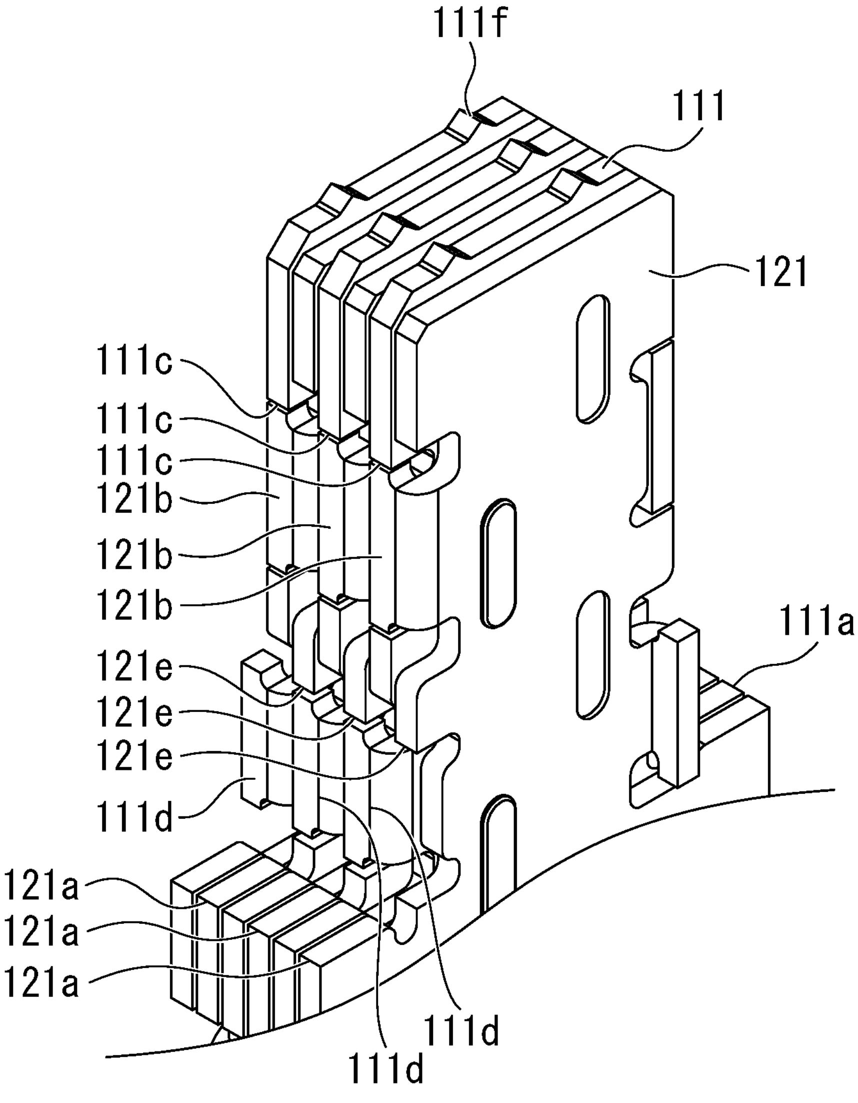
FIG. 12 is a top-left perspective view of the base end portion of the laterally stacked electrical contacts and thermal contacts.
Figure 13:
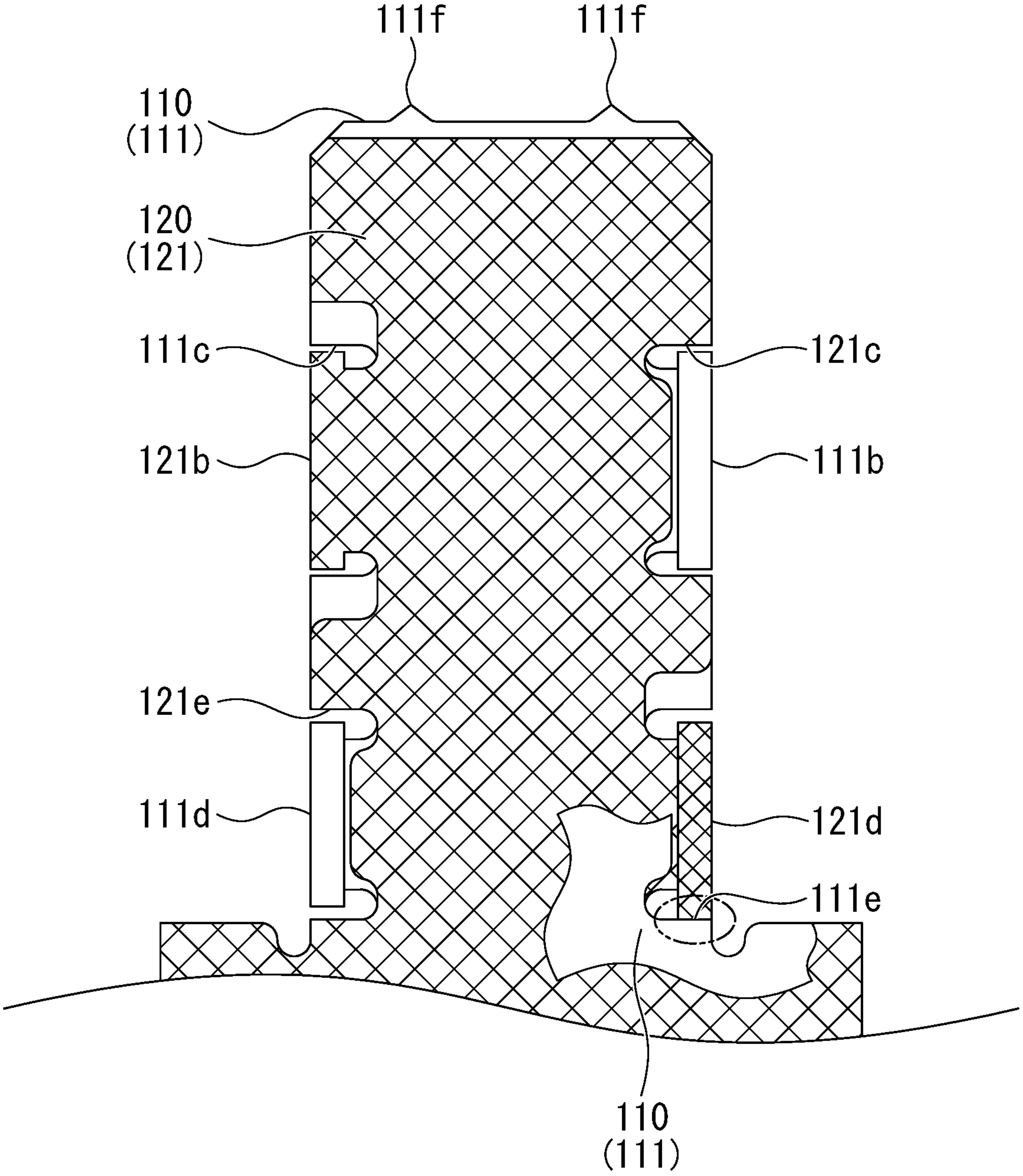
FIG. 13 is a front view of the base end portion of the laterally stacked electrical contacts and thermal contacts (before the electrical contact is pushed down).

In this state, as illustrated in FIG. 11 to FIG. 13, the contact pin 100 has the following structural features in a state where the electrical contacts 110 and the thermal contacts 120 are alternatingly, laterally stacked.

That is, the upper claw 111*b* engages in the upper notch 121*c* adjacent thereto in front, the upper claw 121*b* engages in the upper notch 111*c* adjacent thereto on backside, the lower claw 111*d* engages in the lower notch 121*e* adjacent thereto on backside, and the lower claw 121*d* engages in the lower notch 111*e* adjacent thereto in front.

In this state, as illustrated in FIG. 13, the lower claw 121*d* and the lower notch 111*e* are designed in the dimensions so that the lower end of the lower claw 121*d* is contacted to the lower end of the lower notch 111*e* adjacent in front in a state where the positions of the top face of the wider part 111*a* and the top face of the wider part 121*a* are matched. In FIG. 13, a contact part between a notch and a claw is indicated by a circle of a two-dot chain line.

Further, the upper claw 111*b* and the upper notch 121*c* are designed in the dimensions so as not to be contacted to each other in a state where the positions of the top face of the wider part 111*a* and the top face of the wider part 121*a* are matched.

Further, the upper claw 121*b* and the upper notch 111*c* are designed in the dimensions so as not to be contacted to each other in a state where the positions of the top face of the wider part 111*a* and the top face of the wider part 121*a* are matched.

Further, the lower claw 111*d* and the lower notch 121*e* are designed in the dimensions so as not to be contacted to each other in a state where the positions of the top face of the wider part 111*a* and the top face of the wider part 121*a* are matched.

As illustrated in FIG. 11 to FIG. 13, in a state where the positions of the top face of the wider part 111*a* and the top face of the wider part 121*a* are matched, the upper end (the apexes of the contact protruding parts 111*f*) of the base end side plate-like part 111 is located above the upper end (the top face) of the base end side plate-like part 121. That is, the electrical contact 110 is designed to be taller than the thermal contact 120.

Note that, in FIG. 13, the cross-hatched region (component) represents the thermal contact 120. Further, the white region (component) displayed in a part of the cross-hatched region represents a part of the electrical contact 110 in front of and adjacent to the cross-hatched thermal contact 120. That is, FIG. 13 displays three components, namely, an electrical contact 110, a thermal contact 120, and another electrical contact 110 from back to front. The same applies to FIG. 14.

As illustrated in FIG. 3, in the contact pin 100 configured as described above, a portion from the wider part 111*a* to the wider part 113*a* of the electrical contact 110 and a portion from the wider part 121*a* to the wider part 123*a* of the thermal contact 120 (collectively, referred to as "middle portion of the contact pin 100") are accommodated in the accommodating space 15 defined by the lower recess 11*a* and the upper recess 12*a*.

In this state, the top face of each wider part 111*a* and the top face of each wider part 121*a* are in contact with the top surface of the upper recess 12*a*, and the positions thereof are matched. Further, the bottom face of each wider part 113*a* and the bottom face of each wider part 123*a* are in contact with the bottom surface of the lower recess 11*a*, and the positions thereof are matched.

Further, in this state, the elastic deformation part 112 of the electrical contact 110 and the elastic deformation part 122 of the thermal contact 120 are compressed, and the electrical contact 110 and the thermal contact 120 are shorter than the natural lengths thereof. That is, this is a state where a preload is applied to the electrical contact 110 and the thermal contact 120.

Note that application of a preload is not essential. In such a case, each length of the elastic deformation part 112 of the electrical contact 110 and the elastic deformation part 122 of the thermal contact 120 is substantially the same as the natural length thereof when accommodated in the accommodating space 15.

Further, when the middle portion of the contact pin 100 is accommodated in the accommodating space 15, a portion of the base end side plate-like part 111 above the wider part 111*a* and a portion of the base end side plate-like part 121 above the wider part 121*a* (collectively, referred to as "base end portion of the contact pin 100") are inserted in the upper through hole 12*b* of the upper housing 12, and the ends thereof protrude out of the upper housing 12.

Further, when the middle portion of the contact pin 100 is accommodated in the accommodating space 15, a portion of the tip side plate-like part 113 below the wider part 113*a* and a portion of the tip side plate-like part 123 below the wider part 123*a* (collectively, referred to as "tip portion of the contact pin 100") are inserted in the lower through hole 11*b* of the lower housing 11, and the ends thereof protrude out of the lower housing 11.

Further, when the press-fit claw 113*h* and the press-fit claw 123*h* have been formed, the press-fit claw 113*h* and the press-fit claw 123*h* engage into the circumferential wall of the lower through hole 11*b*, and thereby the contact pin 100 is locked to the lower housing 11.

Next, the motion of the contact pin 100 will be described.

As illustrated in FIG. 13, in a state where the position of the top face of the wider part 111*a* and the top face of the wider part 121*a* are matched, since the upper end of the base end side plate-like part 111 is located above the upper end of the base end side plate-like part 121, the electrical contact 110 first comes into contact with the IC package 20 in the case where the IC package 20 is mounted in the socket for inspection 10 (see FIG. 5).

In the process after the electrical contact 110 has come into contact with the IC package 20, the electrical contact 110 and the thermal contact 120 move as follows.

[When Electrical Contacts are Pushed Down (Contact Pins are Compressed)]

Figure 14:
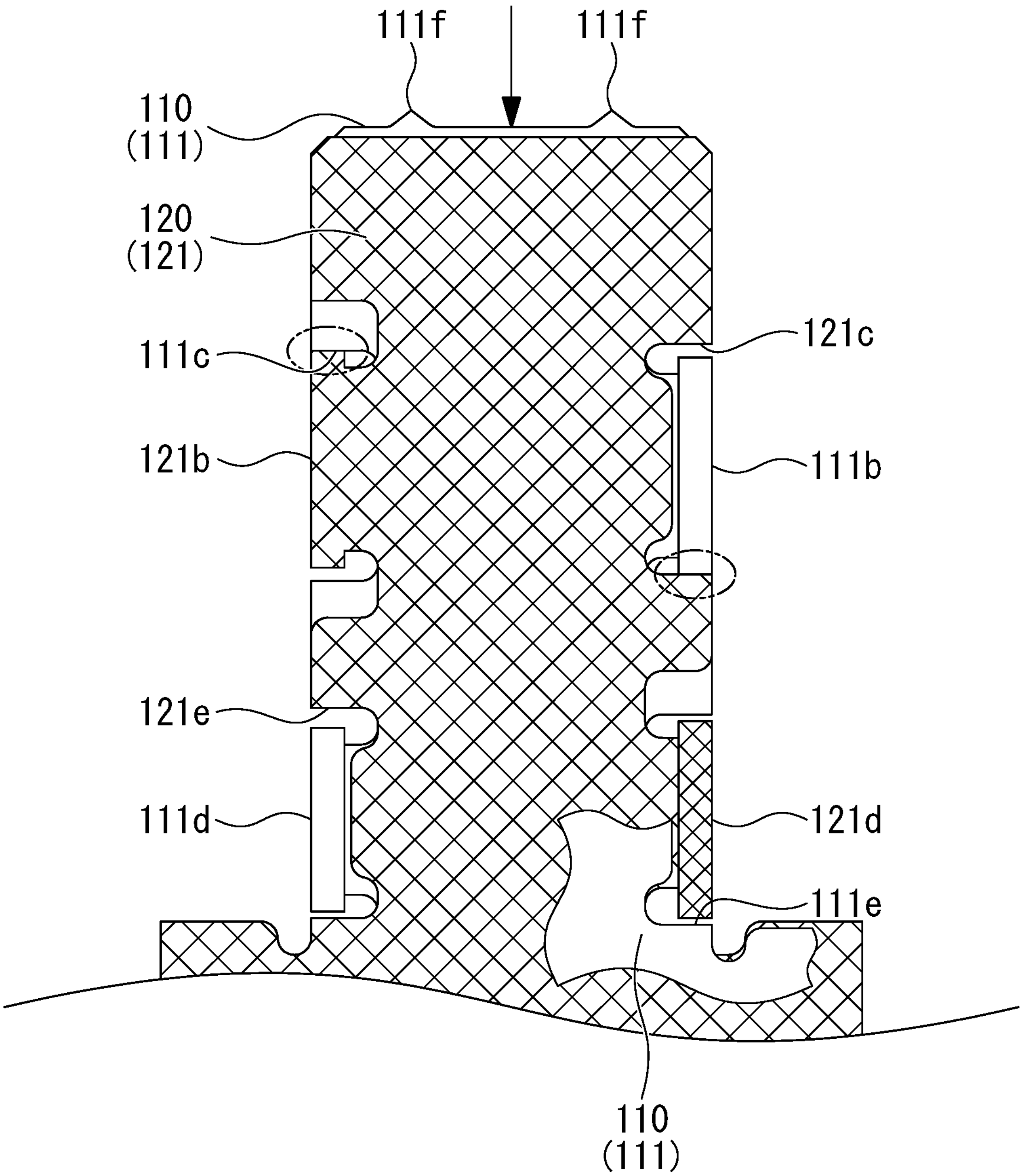
FIG. 14 is a front view of the base end portion of the laterally stacked electrical contacts and thermal contacts (after the electrical contact has been pushed down).

As illustrated in FIG. 13 and FIG. 14, first, only the electrical contact 110 is pushed down by the IC package 20, and the elastic deformation part 112 is compressed.

At this time, the electrical contact 110 is movable independently of the thermal contact 120. That is, during the process in which only the electrical contact 110 is being pushed down by the IC package 20, the electrical contact 110 slides against the thermal contact 120.

Afterwards, when the electrical contact 110 has been pushed down by a predetermined amount, the lower end of the upper claw 111*b* comes into contact with the lower end of the upper notch 121*c* adjacent thereto in front, and the upper end of the upper claw 121*b* comes into contact with the upper end of the upper notch 111*c* adjacent thereto on backside. Further, in response to the electrical contact 110 being lowered, the lower end of the lower notch 111*e* is spaced away from the lower end of the lower claw 121*d* adjacent thereto on backside.

In FIG. 14, a contact part between a notch and a claw is indicated by a circle of a two-dot chain line.

Note that the "predetermined amount" is determined by the distance between the lower end of the upper claw 111*b* and the lower end of the adjacent upper notch 121*c* (the distance between the lower end of the upper claw 121*b* and the lower end of the adjacent upper notch 111*c*) in a state where the positions of the top face of the wider part 111*a* and the top face of the wider part 121*a* are matched.

Further, the "predetermined amount" is smaller than the final displacement by which the electrical contact 110 is pushed down by the IC package 20.

Next, when the electrical contact 110 has been further pushed down (that is, the electrical contact 110 has been pushed down beyond the predetermined amount), since the lower end of the upper claw 111*b* is in contact with the lower end of the upper notch 121*c* and the upper end of the upper notch 111*c* is in contact with the upper end of the upper claw 121*b*, the electrical contact 110 will be further pushed down while interlocked with the thermal contact 120.

That is, when the electrical contact 110 has been pushed down beyond the predetermined amount, the electrical contact 110 and the thermal contact 120 are interlocked in the direction in which the electrical contact 110 is pushed down.

When the electrical contact 110 and the thermal contact 120 are interlocked, the electrical contact 110 is subjected not only to restoring force of the elastic deformation part 112 of its own but also to restoring force of the elastic deformation part 122 of the thermal contact 120 via the contact part. That is, the contact pressure of the electrical contact 110 against the IC package 20 increases, and this improves the electrical contact property.

[When Electrical Contacts are Moved Back to the Original Position (Contact Pins are Expanded)]

When the electrical contact 110 is moved back to the original position from being pushed down beyond the predetermined amount, the electrical contact 110 and the thermal contact 120 are usually expanded at the same time and moved back to the original position.

However, when the thermal contact 120 is stuck (which is a phenomenon of being caught) for some reason, only the electrical contact 110 continues to move back to the original position. Thus, in the process in which the electrical contact 110 is being expanded, the lower end of the lower notch 111*e* comes into contact with the lower end of the lower claw 121*d* adjacent thereto on backside.

In response, the stuck thermal contact 120 is subjected to the restoring force of the elastic deformation part 112 of the electrical contact 110 via the contact part.

Thus, the thermal contact 120 is moved back to the original position while being interlocked with the electrical contact 110. That is, the stuck state of the thermal contact 120 is eliminated.

Further, even when the electrical contact 110 is stuck for some reason, the lower end of the upper notch 121*c* is in contact with the lower end of the upper claw 111*b* adjacent thereto on backside, and the upper end of the upper claw 121*b* is in contact with the upper end of the upper notch 111*c* adjacent on backside. Thus, the stuck electrical contact 110 is subjected to the restoring force of the elastic deformation part 122 of the thermal contact 120 via the contact part.

Thus, the electrical contact 110 is moved back to the original position while being interlocked with the thermal contact 120. That is, the stuck state of the electrical contact 110 is eliminated.

To summarize the above, with the upper claw 111*b* engaged in the upper notch 121*c*, the upper claw 121*b* engaged into the upper notch 111*c*, the lower claw 111*d* engaged into the lower notch 121*e*, and the lower claw 121*d* engaged into the lower notch 111*e*, the followings are configured:

(1) a mechanism (compression interlock mechanism) that interlocks the electrical contact 110 and the thermal contact 120 adjacent thereto in the compression direction when the electrical contact 110 is pushed down (compressed) by a predetermined amount, and (2) a mechanism (expansion interlock mechanism) that interlocks the electrical contact 110 and the thermal contact 120 adjacent thereto in the expansion direction when the electrical contact 110 is moved back to the original position from being pushed down beyond the predetermined amount.

Note that a similar interlock mechanism can be employed also for the tip side plate-like part 113 of the electrical contact 110 and the tip side plate-like part 123 of the thermal contact 120.

In the process of the contact pin 100 being compressed or expanded, the laterally stacked electrical contacts 110 and thermal contacts 120 may slide against each other.

At this time, as illustrated in FIG. 8 and FIG. 9, the protrusions 111*g* and the protrusions 111*h* provided to the base end side plate-like part 111, the protrusions 121*g* and the protrusions 121*h* provided to the base end side plate-like part 121, the protrusions 113*i* and the protrusions 113*j* provided to the tip side plate-like part 113, and the protrusions 123*i* and the protrusions 123*j* provided to the tip side plate-like part 123 function as follows.

As illustrated in FIG. 10, the base end side plate-like part 111 is in contact with the base end side plate-like part 121 adjacent on backside via the protrusions 111*h*. Further, the base end side plate-like part 111 is in contact with the base end side plate-like part 121 adjacent in front via the protrusions 111*g*. Further, the base end side plate-like part 121 is in contact with the base end side plate-like part 111 adjacent on backside via the protrusions 121*h*. Further, the base end side plate-like part 121 is in contact with the base end side plate-like part 111 adjacent in front via the protrusions 121*g*.

In the same manner to the above, the tip side plate-like part 113 is in contact with the tip side plate-like part 123 adjacent on backside via the protrusions 113*j*. Further, the tip side plate-like part 113 is in contact with the tip side plate-like part 123 adjacent in front via the protrusions 113*i*. Further, the tip side plate-like part 123 is in contact with the tip side plate-like part 113 adjacent on backside via the protrusions 123*j*. Further, the tip side plate-like part 123 is in contact with the tip side plate-like part 113 adjacent in front via the protrusions 123*i*.

Further, the protruding amounts of respective protrusions are substantially the same.

Note that, in FIG. 10, the protrusion 111*h* and the protrusion 113*j* indicated by two-dot chain lines represent a view of the protrusion 111*h* and the protrusion 113*j* of the adjacent electrical contact 110 in contact. Further, the protrusion 121*h* and the protrusion 123*j* indicated by two-dot chain lines represent a view of the protrusion 121*h* and the protrusion 123*j* of the adjacent thermal contact 120 in contact.

The protrusions 111*h*, the protrusions 113*j*, the protrusions 121*h*, and the protrusions 123*j* are arranged so as not to interfere with each other when the electrical contacts 110 and the thermal contacts 120 are laterally stacked. Similarly, although not illustrated, the protrusions 111*g*, the protrusions 113*i*, the protrusions 121*g*, and the protrusions 123*i* are arranged so as not to interfere with each other when the electrical contacts 110 and the thermal contacts 120 are laterally stacked.

As described above, because such protrusions are provided, sliding parts are limited to these protrusions on the base end side plate-like part 111 and the base end side plate-like part 121. Thus, sliding with a large face can be avoided, and the sliding area can be reduced.

Herein, in terms of reducing the sliding area, it is preferable that respective protrusions (in particular, the protrusion 111*g*, the protrusion 111*h*, the protrusion 121*g*, and the protrusion 121*h*) have a shape such that the contact part is close to a point as much as possible, such as being tapered in the protruding direction, being hemispherical, or the like.

Furthermore, because such protrusions are provided, a clearance is ensured between the electrical contact 110 and the thermal contact 120. Further, the distance (the dimension of the clearance) between the electrical contact 110 and the thermal contact 120 can be determined by the protruding amount of these protrusions.

By suitably setting this clearance, that is, by suitably setting the protruding amount of each protrusion, it is possible to prevent melted solder or flux from rising in the clearance due to a capillary phenomenon when the socket for inspection 10 is mounted on the printed wiring board.

Further, because such a clearance is provided, the electrical contact 110 and the thermal contact 120 are spaced away from each other in the plate thickness direction, and therefore, a larger bending amount can be ensured for each claw (the upper claw 111*b*, the lower claw 111*d*, the upper claw 113*b*, the lower claw 113*d*, the upper claw 121*b*, the lower claw 121*d*, the upper claw 123*b*, and the lower claw 123*d*). A smaller bending amount may make it difficult to bend each claw in press machining and result in a poor machining property. Accordingly, the bending amount is ensured as large as possible, and thereby the machining property in press machining is improved.

Further, because such a clearance is provided, interference with a punching burr occurring on the thermal contact 120 or the electrical contact 110 facing the electrical contact 110 or the thermal contact 120 can be avoided.

Further, because such a clearance is provided, vibration (motion in the plate thickness direction) of the elastic deformation part 112 of the electrical contact 110 or the elastic deformation part 122 of the thermal contact 120 can be absorbed by the clearance.

Note that, when the protruding amounts are made equal for all the protrusions, the electrical contact 110 and the thermal contact 120 are made parallel. In detail, the base end side plate-like part 111 and the base end side plate-like part 121 are made parallel, and the tip side plate-like part 113 and the tip side plate-like part 123 are made parallel.

<Casing>

The electrical contact 110 and the thermal contact 120 configured as set forth are bundled and held by the casing 140, as illustrated in FIG. 7.

The casing 140 is formed such that Ni plating as an undercoat is applied to a substrate of a Cu based material (for example, beryllium copper), and plating whose main component is an Au based material is applied to the surface of the Ni layer. Note that, while these materials are mere examples, the casing 140 has substantially the same electrical conductivity as or preferably higher electrical conductivity than the electrical contact 110 and the thermal contact 120.

Figure 15:
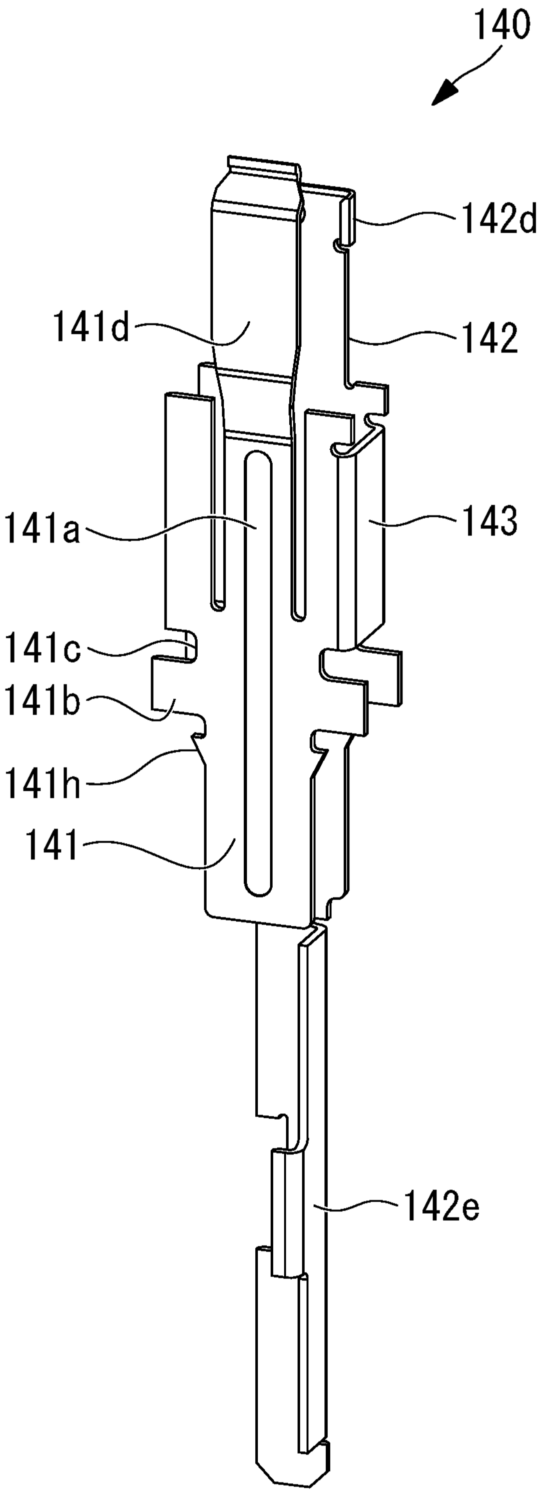
FIG. 15 is a perspective view of the front side of a casing.
Figure 16:
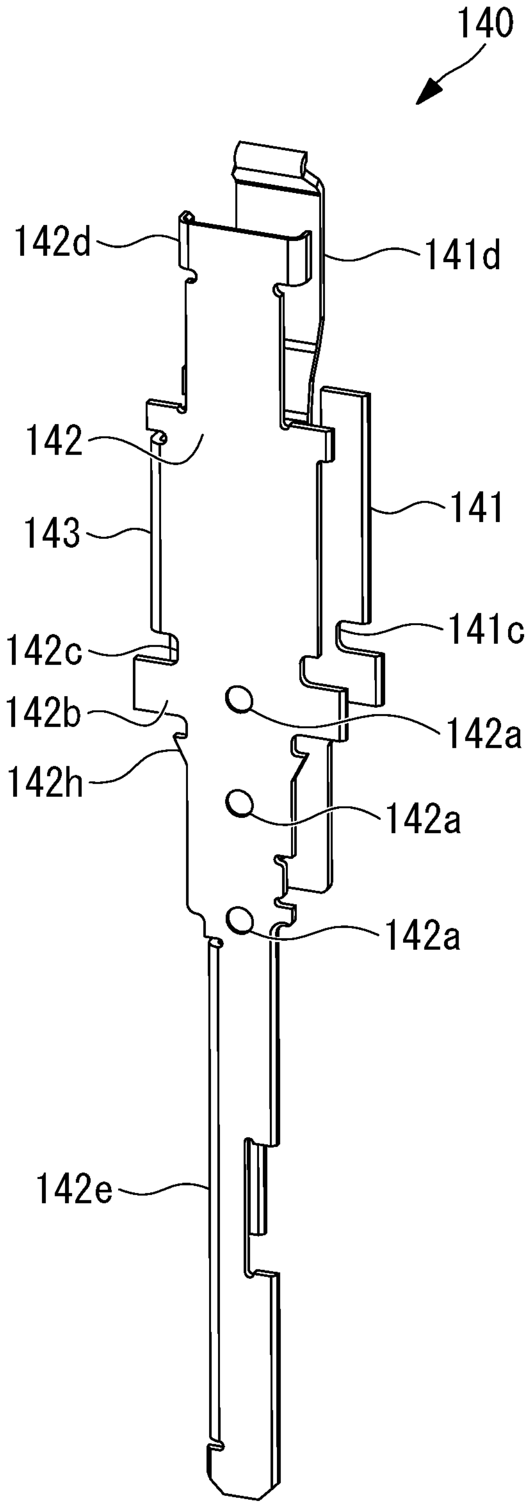
FIG. 16 is a perspective view of the back side of the casing.
Figure 17:
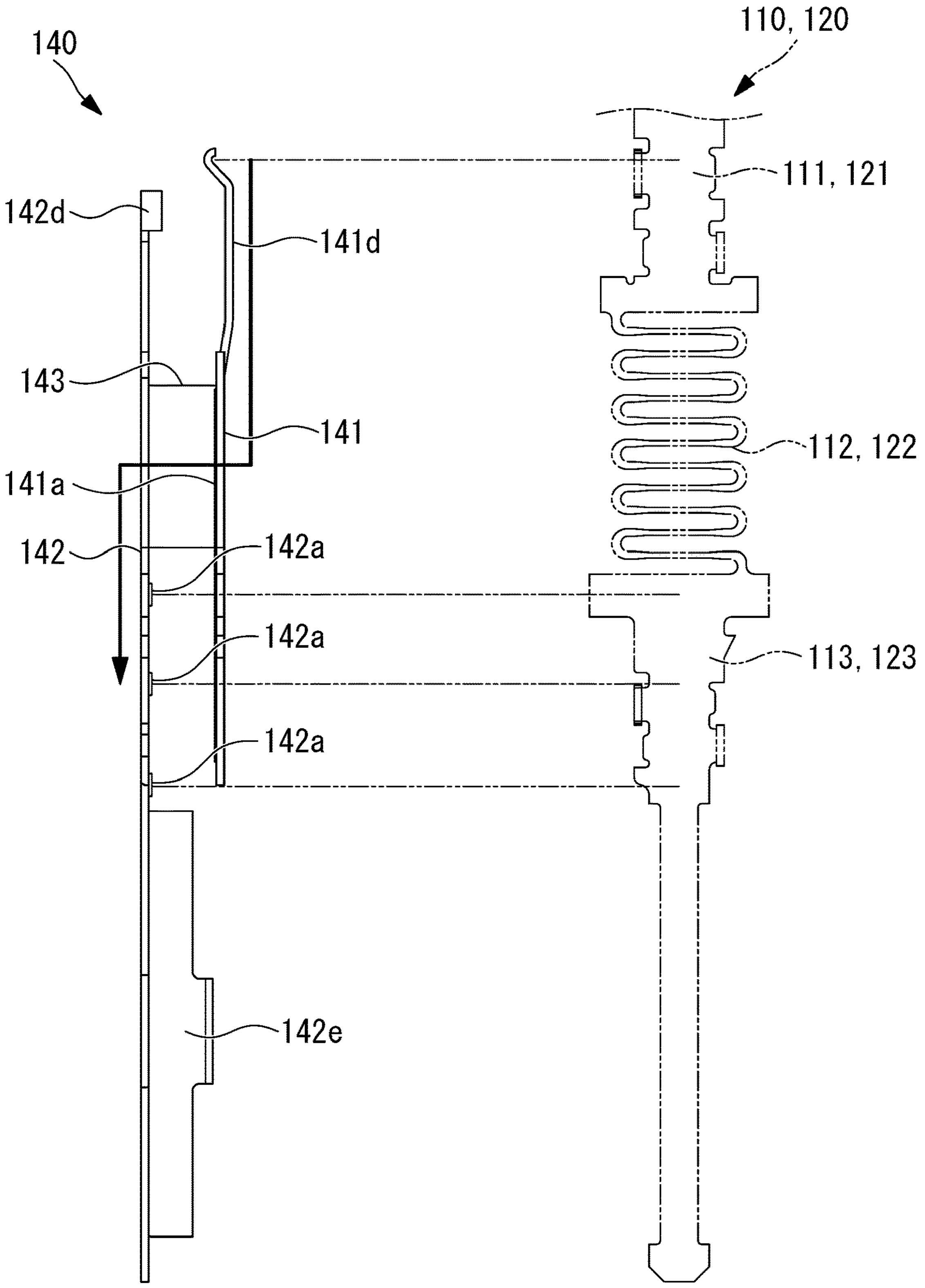
FIG. 17 is a side view of the casing.

As illustrated in FIG. 15 to FIG. 17, the casing 140 has a first plate-like part 141, a second plate-like part (stationary piece) 142 facing the first plate-like part 141, and a connecting plate-like part 143 connecting these plate-like parts to each other.

The first plate-like part 141 is a plate-like portion extending in the same direction as the electrical contact 110 and the thermal contact 120.

In the first plate-like part 141, a movable piece 141*d* is formed in the upper part, a wider part 141*b* and a press-fit claw 141*h* are formed in the middle, and a protrusion 141*a* is formed below the movable piece 141*d*.

As illustrated in FIG. 17, the movable piece 141*d* has a bent part located above the upper end of the second plate-like part 142 and being convex on the second plate-like part 142 side, and this bent part is elastically contacted to the base end side plate-like part 111 of the electrical contact 110 located at the outermost face or the base end side plate-like part 121 of the thermal contact 120 located at the outermost face.

As illustrated in FIG. 15 or FIG. 16, the wider part 141*b* is a portion where both side faces of the first plate-like part 141 are partially widened in the width direction.

As illustrated in FIG. 15, the press-fit claw 141*h* is a protrusion formed on both side faces of the first plate-like part 141 below the wider part 141*b*.

The press-fit claw 141*h* has a function of locking the casing 140 to the lower housing 11. Note that, when it is not required to lock the casing 140 to the lower housing 11, the press-fit claw 141*h* may be omitted.

The protrusion 141*a* has a vertically long shape formed from an area near the base end of the movable piece 141*d* to the lower part of the first plate-like part 141 and protrudes toward the second plate-like part 142 side (backside of FIG. 15).

The protrusion 141*a* is a portion that, when the casing 140 is overlapped with another casing 140, is contacted to the second plate-like part 142 of another casing 140.

The second plate-like part 142 is a plate-like portion extending in the same direction as the electrical contact 110 and the thermal contact 120.

The second plate-like part 142 is arranged facing the first plate-like part 141.

In the second plate-like part 142, a base end holding part 142*d* is formed in the upper part, a wider part 142*b* and a press-fit claw 142*h* are formed in the middle, and a tip holding part 142*e* is formed in the lower part.

As illustrated in FIG. 15 to FIG. 17, the base end holding part 142*d* is a claw-like portion protruding from both side faces of the second plate-like part 142 toward the first plate-like part 141.

As illustrated in FIG. 15 or FIG. 16, the wider part 142*b* is a portion where both side faces of the second plate-like part 142 are partially widened in the width direction.

As illustrated in FIG. 15 to FIG. 17, the tip holding part 142*e* is a portion protruding from the first side face of the second plate-like part 142 to the first plate-like part 141 side (front side in FIG. 15) and bent such that a part of the end face thereof is made parallel to the second plate-like part 142.

As illustrated in FIG. 16, the press-fit claw 142*h* is a protrusion formed on both side faces of the second plate-like part 142 below the wider part 142*b*.

The press-fit claw 142*h* has a function of locking the casing 140 to the lower housing 11. Note that, when it is not required to lock the casing 140 to the lower housing 11, the press-fit claw 142*h* may be omitted.

The connecting plate-like part 143 is a plate-like portion connecting the first side face of the first plate-like part 141 and the first side face of the second plate-like part 142 to each other above the wider part 141*b* and the wider part 142*b*.

As illustrated in FIG. 17, a plurality of circular protrusions 142*a* protruding toward the first plate-like part 141 side (backside in FIG. 17) are formed on a portion inside the second plate-like part 142 corresponding to the position of the tip side plate-like part 113 of the electrical contact 110 or the tip side plate-like part 123 of the thermal contact 120. The protruding amounts of respective protrusions 142*a* are substantially the same.

The protrusions 142*a* are portions that are contacted to the tip side plate-like part 113 of the electrical contact 110 located at the outermost face or the tip side plate-like part 123 of the thermal contact 120 located at the outermost face.

Note that the shape of the protrusion 142*a*, the number of protrusions 142*a*, and the arrangement of the protrusions 142*a* are not limited to the depicted form.

It is preferable to prepare two casings 140 each configured as described above, as illustrated in FIG. 18.

Each casing 140 is fitted from the side of the electrical contact 110 and the thermal contact 120 so that the laterally stacked electrical contacts 110 and thermal contacts 120 are inserted between the first plate-like part 141 and the second plate-like part 142. In this state, the second plate-like part 142 of the other casing 140 is overlapped with the inside of the first plate-like part 141 of one casing 140, and the second plate-like part 142 of the one casing 140 is overlapped with the inside of the first plate-like part 141 of the other casing 140.

Accordingly, each casing 140 holds the laterally stacked electrical contacts 110 and thermal contacts 120 so that the laterally stacked electrical contacts 110 and thermal contacts 120 are slidable against each other by each movable piece 141*d*. Further, each casing 140 guides the laterally stacked electrical contacts 110 and thermal contacts 120 by the connecting plate-like part 143, the base end holding part 142*d*, and the tip holding part 142*e* so that the laterally stacked electrical contacts 110 and thermal contacts 120 do not fluctuate.

Figure 19:
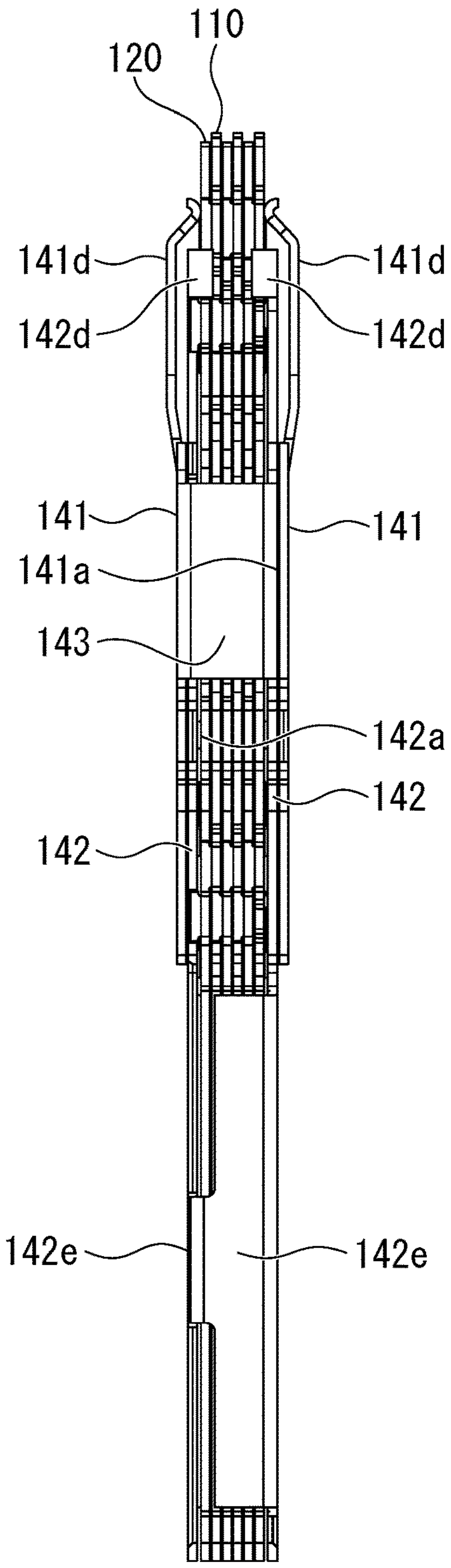
FIG. 19 is a side view of the contact pin.
Figure 20:
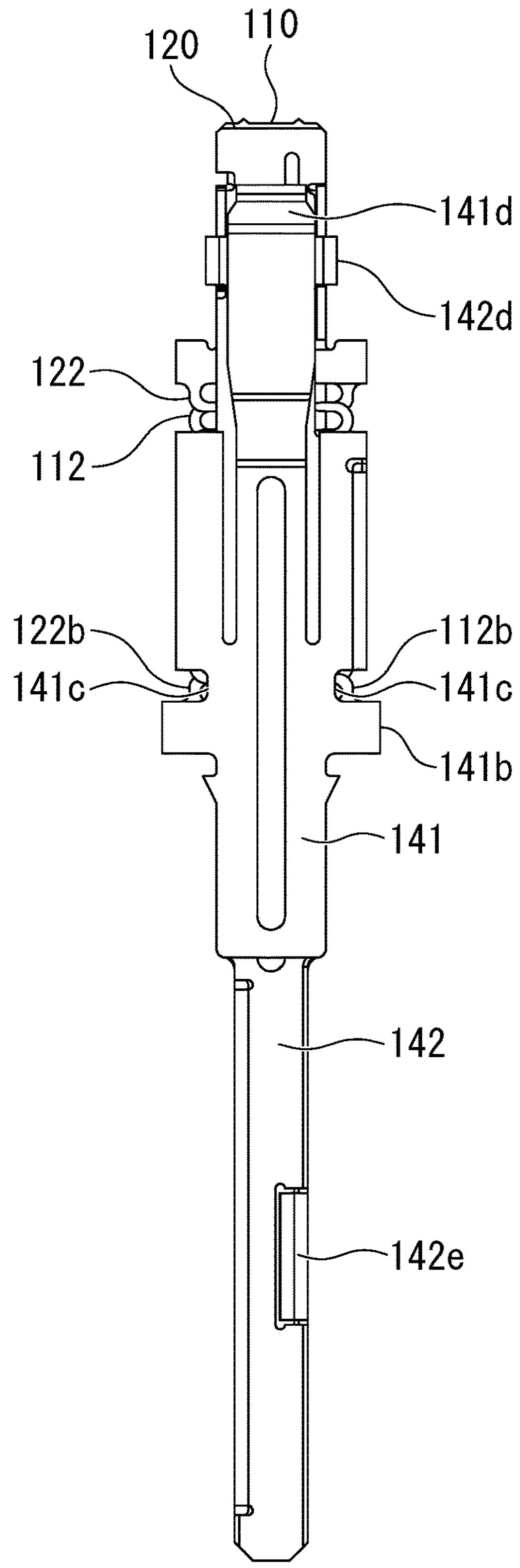
FIG. 20 is a front view of the contact pin.

Thus, as illustrated in FIG. 7, FIG. 19, and FIG. 20, the laterally stacked electrical contacts 110 and thermal contacts 120 are bundled by the two casings 140 in a state where a moderate contact pressure is maintained in the lateral stacking direction. Further, since the casings 140 function as a guide for the laterally stacked electrical contacts 110 and thermal contacts 120, the straightness in expansion and compression of the electrical contact 110 and the thermal contact 120 is improved.

In this state, the casing 140 is in contact with the electrical contact 110 and the thermal contact 120 so as to bypass the elastic deformation part 112 of the electrical contact 110 and the elastic deformation part 122 of the thermal contact 120 by the bent part of the movable piece 141*d* and the protrusion 142*a* of the second plate-like part 142.

Accordingly, a path bypassing the elastic deformation part 112 and the elastic deformation part 122 having long paths and thus having high electrical resistance or thermal resistance can be formed by using the casing 140, as indicated by the arrow illustrated in FIG. 17.

Figure 18:
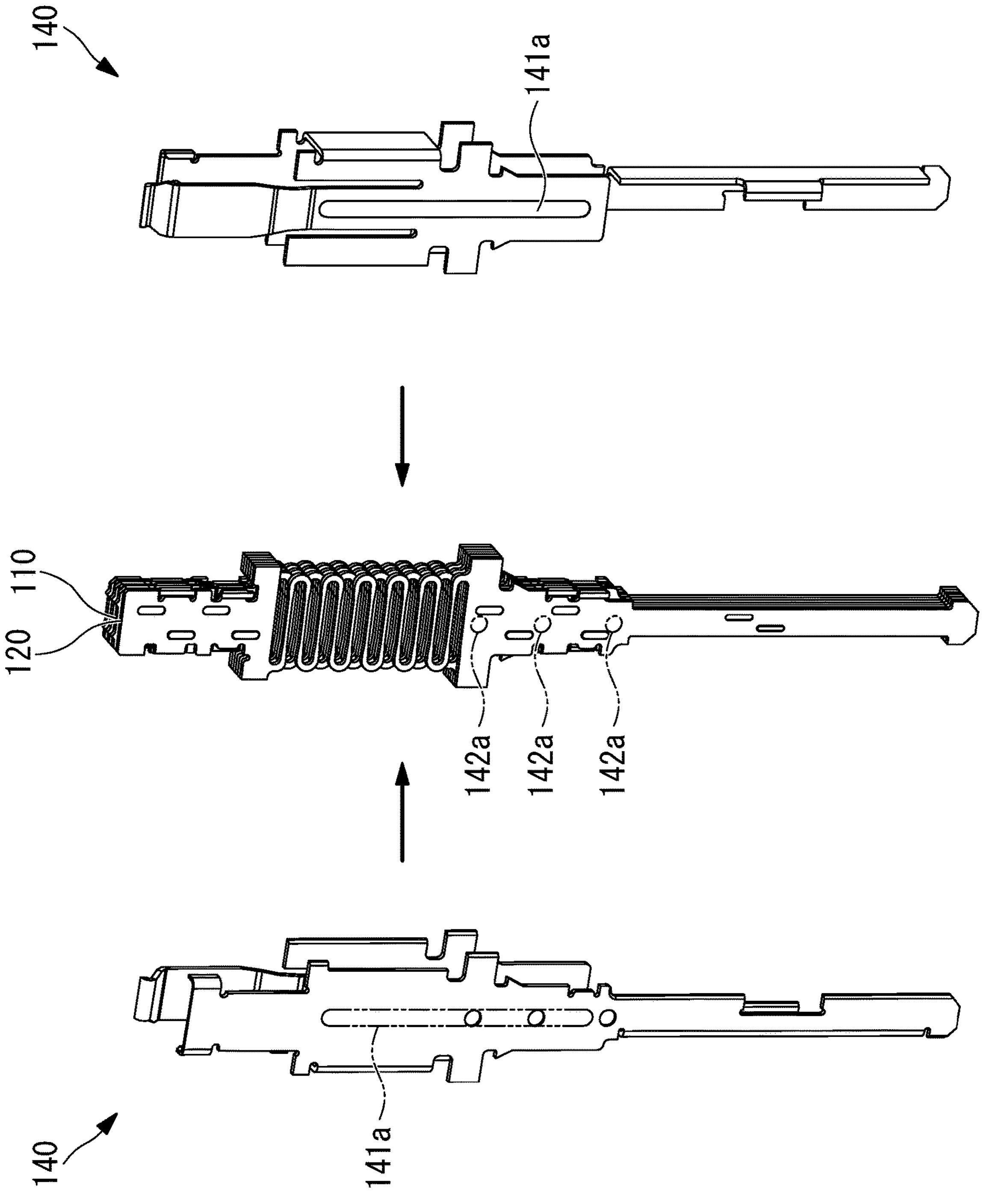
FIG. 18 is a perspective view of a state where the laterally stacked electrical contacts and thermal contacts and the casing are aligned.

Further, as illustrated in FIG. 18 and FIG. 19, in a state where two casings 140 are overlapped with each other, the protrusion 141*a* formed on the first plate-like part 141 of one casing 140 comes into contact with the second plate-like part 142 of the other casing 140, and thereby a clearance is ensured between the first plate-like part 141 (the portion except for the protrusion 141*a*) of the one casing 140 and the second plate-like part 142 of the other casing 140. Further, the distance between the first plate-like part 141 of one casing 140 and the second plate-like part 142 of the other casing 140 can be determined by the protruding amount of the protrusion 141*a*.

By suitably setting this clearance, that is, by suitably setting the protruding amount of the protrusion 141*a*, it is possible to prevent melted solder or flux from rising in the clearance due to a capillary phenomenon.

Further, because such a clearance is provided, interference with a punching burr occurring on the second plate-like part 142 of another casing 140 facing the first plate-like part 141 can be avoided.

Further, when the protrusion 141*a* is formed from a position closer to the movable piece 141*d* as much as possible, the protrusion 141*a* can be contacted to the upper part (that is, a position close to the IC package 20) of the second plate-like part 142 of another casing 140 that is the contact target. Further, with the protrusion 141*a* having a vertically long shape, the contact area with the second plate-like part 142 can be increased. This can improve heat dissipation performance via the casing 140.

Herein, in FIG. 18, the protrusion 141*a* indicated by a two-dot chain line in the second plate-like part 142 of the left casing 140 represents a contact part with the protrusion 141*a* formed on the first plate-like part 141 of the right casing 140.

Further, in a state where the casing 140 holds the laterally stacked electrical contacts 110 and thermal contacts 120, when the protrusion 142*a* formed on the second plate-like part 142 of the casing 140 comes into contact with the electrical contact 110 or the thermal contact 120, a clearance is ensured between the second plate-like part 142 (the portion except for the protrusion 142*a*) of the casing 140 and the electrical contact 110 or the thermal contact 120. Further, the distance between the second plate-like part 142 and the electrical contact 110 or the thermal contact 120 can be determined by the protruding amount of the protrusion 142*a*.

By suitably setting this clearance, that is, by suitably setting the protruding amount of the protrusion 142*a*, it is possible to prevent melted solder or flux from rising in the clearance due to a capillary phenomenon.

Further, because such a clearance is provided, the second plate-like part 142 and the electrical contact 110 or the thermal contact 120 are spaced away from each other in the plate thickness direction, and therefore, a larger bending amount can be ensured for the tip holding part 142*e* that holds the electrical contact 110 or the thermal contact 120. A smaller bending amount may make it difficult to bend the tip holding part 142*e* in press machining and result in a poor machining property. Accordingly, the bending amount is ensured as large as possible, and thereby the machining property in press machining is improved.

Further, because such a clearance is provided, interference with a punching burr occurring on the electrical contact 110 or the thermal contact 120 facing the second plate-like part 142 can be avoided.

Further, because such a clearance is provided, vibration (motion in the plate thickness direction) of the elastic deformation part 112 of the electrical contact 110 or the elastic deformation part 122 of the thermal contact 120 facing the second plate-like part 142 can be absorbed by the clearance.

Herein, the protrusion 142*a* indicated by a two-dot chain line in the front thermal contact 120 represents a contact part with the protrusion 142*a* formed on the second plate-like part 142 of the left casing 140.

Note that, although one casing 140 may be enough, it is preferable to provide two casings 140 in terms of stability of holding or the function as a guide.

Further, also in terms of ensuring a large sectional area of the bypass path, it is preferable to use two casings 140.

The casing 140 is molded by, for example, press machining from a plate material that becomes the substrate.

Accordingly, a large number of casings 140 can be produced with high accuracy and with suppressed variation among products.

The contact pin 100 formed as described above may have at least any one of the following mechanisms.

<Mechanism for Preventing Excessive Compression>

As illustrated in FIG. 7, the contact pin 100 may be configured such that, when the electrical contact 110 and the thermal contact 120 are pushed down, the bottom face of the wider part 111*a* of the electrical contact 110 and the bottom face of the wider part 121*a* of the thermal contact 120 come into contact with the top face of the connecting plate-like part 143 of the casing 140. That is, the top face of the connecting plate-like part 143 may be used as a stopper against the bottom face of the wider part 111*a* and the bottom face of the wider part 121*a*.

This makes it possible to restrict the amount of compression of the electrical contact 110 and the thermal contact 120 and therefore prevent the electrical contact 110 and the thermal contact 120 from being excessively compressed and damaged.

<Mechanism (Notch) for Preventing Solder Wicking/Flux Wicking>

As illustrated in FIG. 15, FIG. 16, and FIG. 20, in the assembled contact pin 100, the notch 141*c* and the notch 142*c* that expose the lower end 112*b* of the elastic deformation part 112 and the lower end 122*b* of the elastic deformation part 122 may be provided in the first plate-like part 141 and the second plate-like part 142 of the casing 140.

In the case of FIG. 20, the notch 141*c* is formed in the first plate-like part 141 right above the wider part 141*b*, and the notch 142*c* is formed in the second plate-like part 142 right above the wider part 142*b*.

Even when solder wicking or flux wicking occurs when the contact pin 100 is soldered, the notch 141*c* and the notch 142*c* allow the melted solder or flux to flow so as to avoid the lower end 112*b* of the elastic deformation part 112 and the lower end 122*b* of the elastic deformation part 122.

Accordingly, the elastic deformation part 112 and the elastic deformation part 122 are not stuck by solder or flux, and desired elasticity can be exerted.

<Mechanism (Region R) for Preventing Solder Wicking/Flux Wicking>

Figure 21:
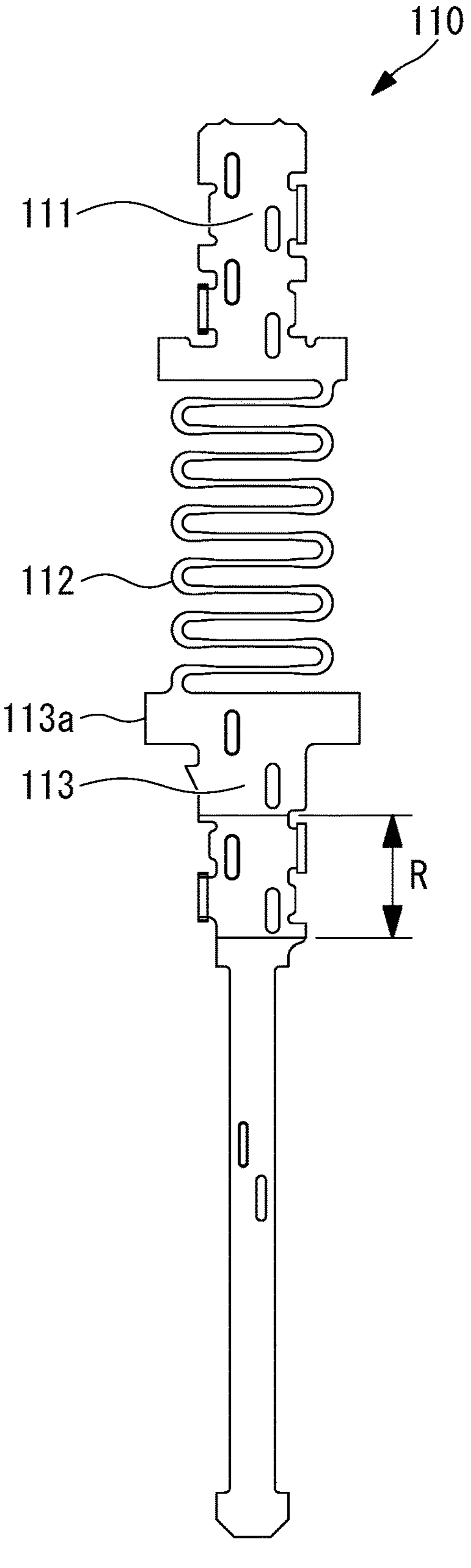
FIG. 21 is a front view of the electrical contact.

As illustrated in FIG. 21, a region R having a lower wettability than other regions may be provided on the surface of the tip side plate-like part 113 of the electrical contact 110. In the case of FIG. 21, the region R is provided in a portion of the tip side plate-like part 113 below the wider part 113*a*.

Accordingly, even when solder wicking or flux wicking occurs when the contact pin 100 is soldered, the melted solder or flux will be retained in the region R, and the elastic deformation part 112 are not stuck by the solder or flux. Thus, desired elasticity can be exerted.

Note that the region R may also be provided in the thermal contact 120.

An example method of reducing wettability may be a method of applying masking to a portion corresponding to the region R in advance before applying plating of an Au based material to the electrical contact 110 and then exposing the Ni layer that is the undercoat in the region R.

Figure 22:
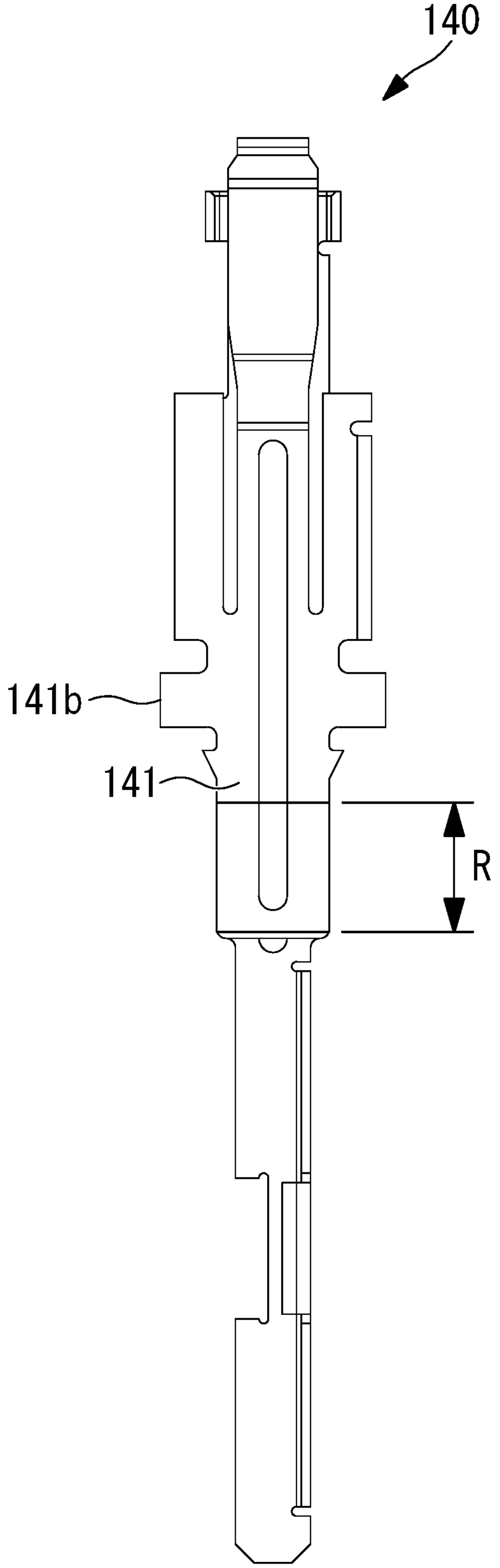
FIG. 22 is a front view of the casing.
Figure 23:
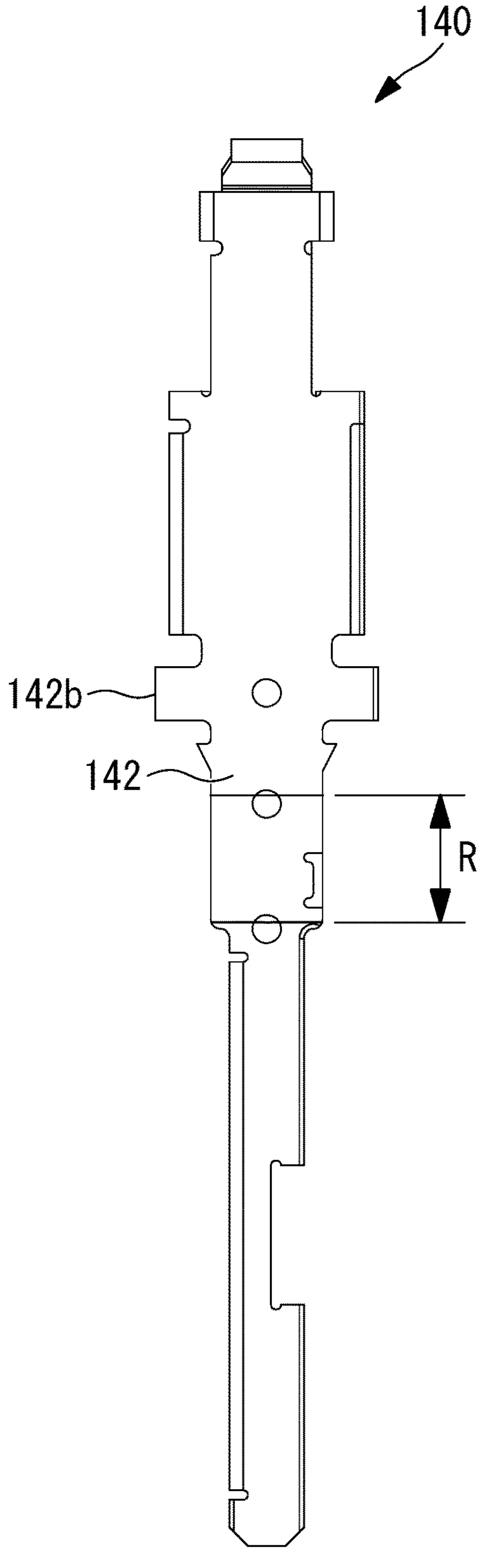
FIG. 23 is a back view of the casing.

Further, as illustrated in FIG. 22 and FIG. 23, the region R having a lower wettability than other regions may be provided on the surface of the first plate-like part 141 and the second plate-like part 142 in the casing 140 in the same manner as with the electrical contact 110.

It is preferable to provide the region R in a portion located below the elastic deformation part 112 and the elastic deformation part 122, for example, a portion below the wider part 141*b* of the first plate-like part 141 and a portion below the wider part 142*b* of the second plate-like part 142 when the casing 140 bundles the electrical contacts 110 and the thermal contacts 120.

[Combination of Contact Pins]

The example of two types of contacts, namely, the electrical contact 110 and the thermal contact 120 shorter than the electrical contact 110 has been described so far.

Figure 24:
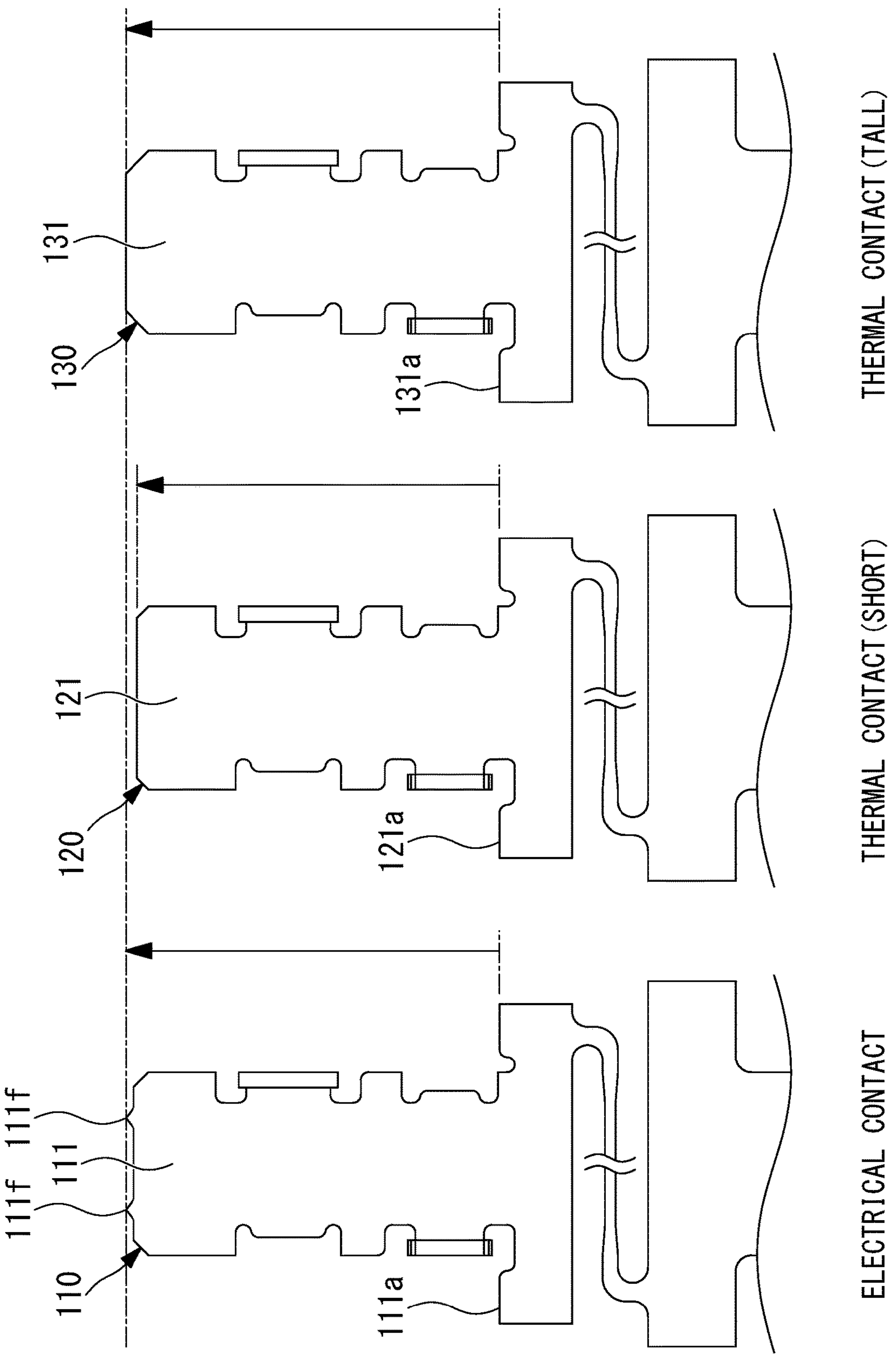
FIG. 24 is a front view for comparison between base end portions of the electrical contact, a shorter thermal contact, and a taller thermal contact.

However, the contact pin 100 may be configured in accordance with the use by preparing a thermal contact 130 having the same vertical height as the electrical contact 110, as illustrated in FIG. 24, and then selecting and combining some of the listed contacts, as illustrated in the table of FIG. 25.

Note that "height (shorter/taller)" means the distance from the top face of the wider part 111*a*, 121*a*, 131*a* to the upper end of the base end side plate-like part 111, 121, 131, as illustrated in FIG. 24.

Further, the thermal contact 130 may be denoted as "taller thermal contact 130" for convenience.

<Only Electrical Contact>

Figure 26:
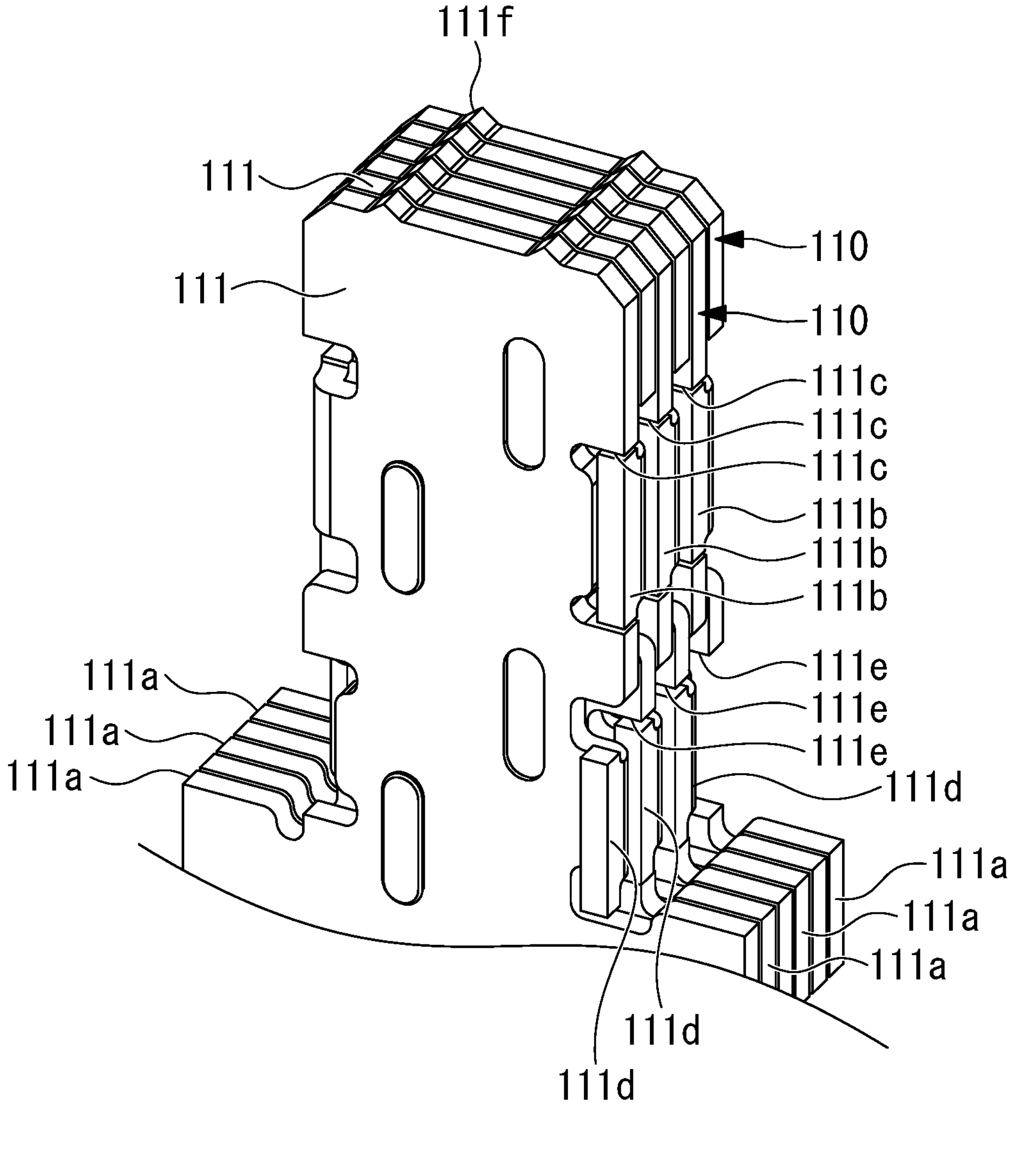
FIG. 26 is a top-right perspective view of base end portions of laterally stacked electrical contacts.

As illustrated in FIG. 26, the contact pin 100 may be formed of only the electrical contacts 110 for all the contacts.

This contact pin 100 is used when the primary purpose is to have electrical contact with the IC package 20.

In such a configuration, all the electrical contacts 110 will be in contact with the IC package 20.

In this state, since the electrical contacts 110 are movable independent of each other, even when the E-Pad of the IC package 20 has distortion or the heights of these electrical contacts 110 have slight variation, the levels can be compensated to absorb the distortion or the slight variation. As used herein, "slight variation" refers to variation within a smaller range than the distance between the lower end of the upper claw 111*b* and the lower end of the adjacent upper notch 111*c*.

Note that, since all the electrical contacts 110 have the same height, the compression interlock mechanism does not function.

<Electrical Contact+Thermal Contact (Short)>

As already described, as illustrated in FIG. 11, the contact pin 100 may be formed of the electrical contacts 110 and the shorter thermal contacts 120 in combination.

This contact pin 100 is used when the purpose is to have electrical contact and thermal contact with the IC package 20.

In such a configuration, the electrical contacts 110 will be in contact with the IC package 20.

In this state, since the electrical contacts 110 are movable independent of each other in a predetermined range of the pushed-down amount, even when the E-Pad of the IC package 20 has distortion or the heights of these electrical contacts 110 have slight variation, the levels can be compensated to absorb the distortion or the slight variation. As used herein, "slight variation" refers to variation within a smaller range than the distance between the lower end of the upper claw 111*b* and the lower end of the adjacent upper notch 121*c* (the distance between the lower end of the upper claw 121*b* and the lower end of the adjacent upper notch 111*c*).

Further, the contact pressure at the electrical contact 110 against the IC package 20 is increased by the compression interlock mechanism, and the electrical contact property is thus improved. Further, stuck prevention is realized by the expansion interlock mechanism.

Note that, although the thermal contact 120 is not contacted to the IC package 20, heat of the IC package 20 is transferred to the thermal contact 120 via the electrical contact 110. Thus, the thermal contact 120 has a function of increasing the sectional area of the heat transfer path, and as a result, the thermal performance is improved.

<Electrical Contact+Thermal Contact (Tall)>

Figure 27:
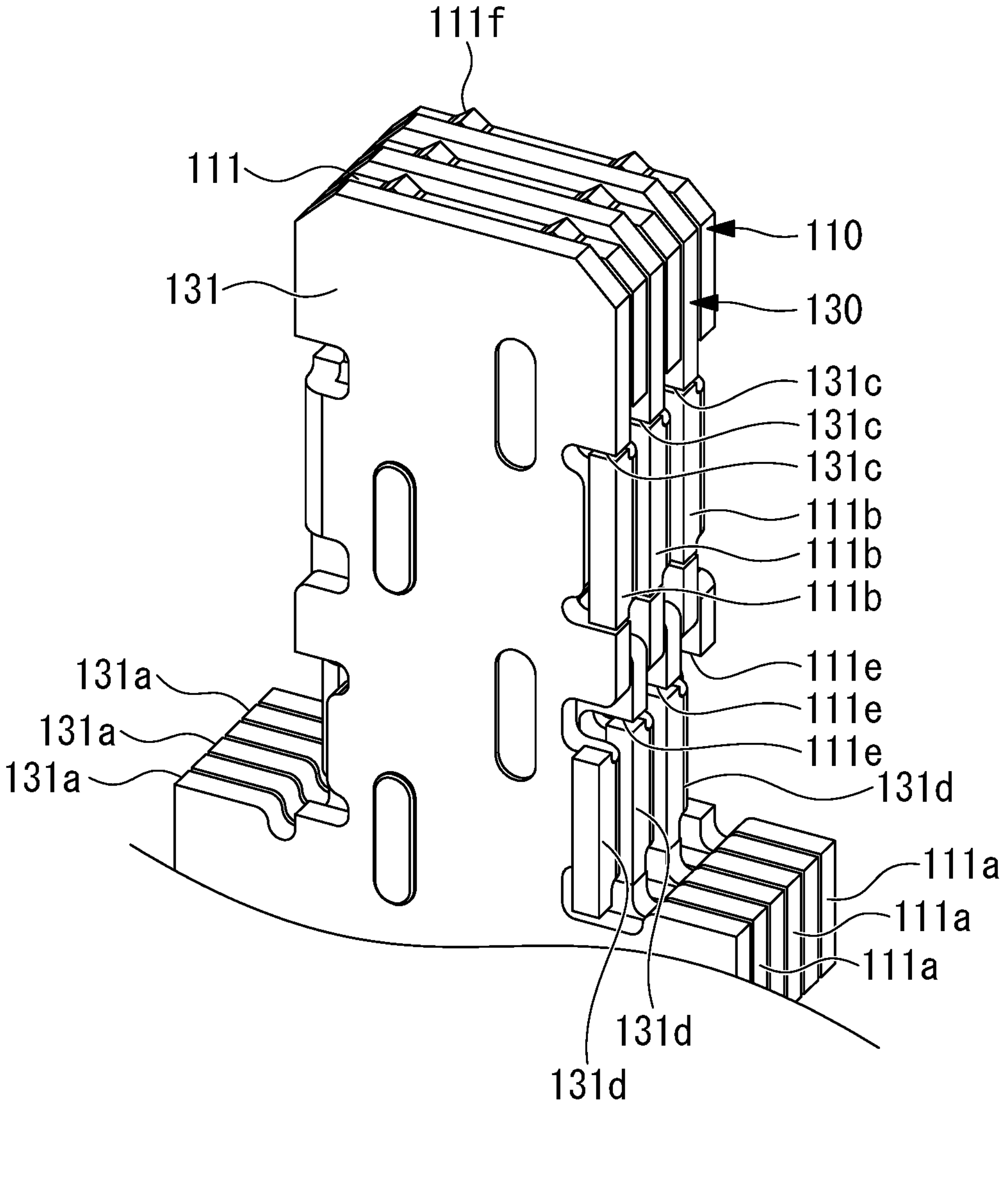
FIG. 27 is a top-right perspective view of base end portions of laterally stacked electrical contacts and taller thermal contacts.

As illustrated in FIG. 27, the contact pin 100 may be formed of the electrical contacts 110 and the taller thermal contacts 130 in combination.

This contact pin 100 is used when the purpose is to have electrical contact and thermal contact with the IC package 20.

In such a configuration, all the electrical contacts 110 and all the thermal contacts 130 will be in contact with the IC package 20.

In this state, since the electrical contacts 110 and the thermal contacts 130 are movable independent of each other, even when the E-Pad of the IC package 20 has distortion or the heights of these electrical contacts 110 have slight variation, the levels can be compensated to absorb the distortion or the slight variation. As used herein, "slight variation" refers to variation within a smaller range than the distance between the lower end of the upper claw 111*b* and the lower end of the adjacent upper notch 131*c*.

Further, since the thermal contact 130 is directly contacted to the IC package 20, the thermal performance is improved. Furthermore, the thermal contact 130 and the IC package are contacted to each other at the surfaces thereof, which is advantageous in efficiency of heat transfer.

Note that, since all the electrical contacts 110 and the thermal contacts 130 have the same height, the compression interlock mechanism does not function.

<Thermal Contact (Short)+Thermal Contact (Tall)>

Figure 28:
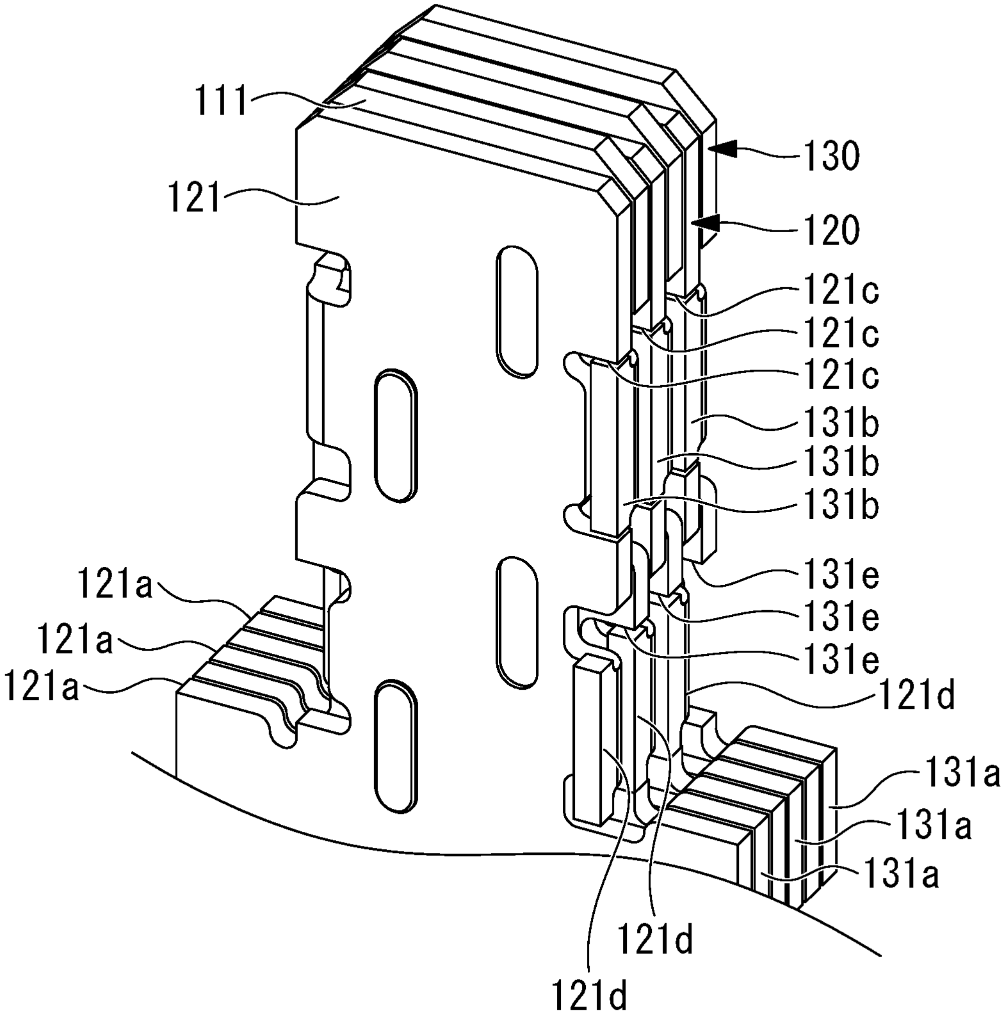
FIG. 28 is a top-right perspective view of base end portions of laterally stacked shorter thermal contacts and taller thermal contacts.

As illustrated in FIG. 28, the contact pin 100 may be formed of the shorter thermal contacts 120 and the taller thermal contacts 130 in combination.

This contact pin 100 is used when the purpose is to have electrical contact and thermal contact with the IC package 20.

In such a configuration, all the taller thermal contacts 130 will be in contact with the IC package 20.

In this state, since the thermal contacts 130 are movable independent of each other in a predetermined range of the pushed-down amount, even when the E-Pad of the IC package has distortion or the heights of these thermal contacts 130 have slight variation, the levels can be compensated to absorb the distortion or the slight variation. As used herein, "slight variation" refers to variation within a smaller range than the distance between the lower end of the upper claw 131*b* and the lower end of the adjacent upper notch 121*c*.

Further, the contact pressure at the thermal contact 130 against the IC package 20 is increased by the compression interlock mechanism, and the electrical contact property is thus improved. Further, stuck prevention is realized by the expansion interlock mechanism.

Note that, although the thermal contact 120 is not contacted to the IC package 20, heat of the IC package 20 is transferred to the thermal contact 120 via the thermal contact 130. Thus, the thermal contact 120 has a function of increasing the sectional area of the heat transfer path, and as a result, the thermal performance is improved.

<Only Thermal Contact>

For example, the contact pin 100 may be formed of only the shorter thermal contacts 120 for all the contacts.

This contact pin 100 is used when the primary purpose is to have thermal contact with the IC package 20.

In such a configuration, all the thermal contacts 120 will be in contact with the IC package 20.

In this state, since the thermal contacts 120 are movable independent of each other, even when the E-Pad of the IC package 20 has distortion or the heights of these thermal contacts 120 have slight variation, the levels can be compensated to absorb the distortion or the slight variation. As used herein, "slight variation" refers to variation within a smaller range than the distance between the lower end of the upper claw 121*b* and the lower end of the adjacent upper notch 121*c*.

Note that, since all the thermal contacts 120 have the same height, the compression interlock mechanism does not function.

The same applies to a case where the contact pin 100 is formed of only the taller thermal contacts 130 for all the contacts.

[Modified Example of Casing]

Figure 29:
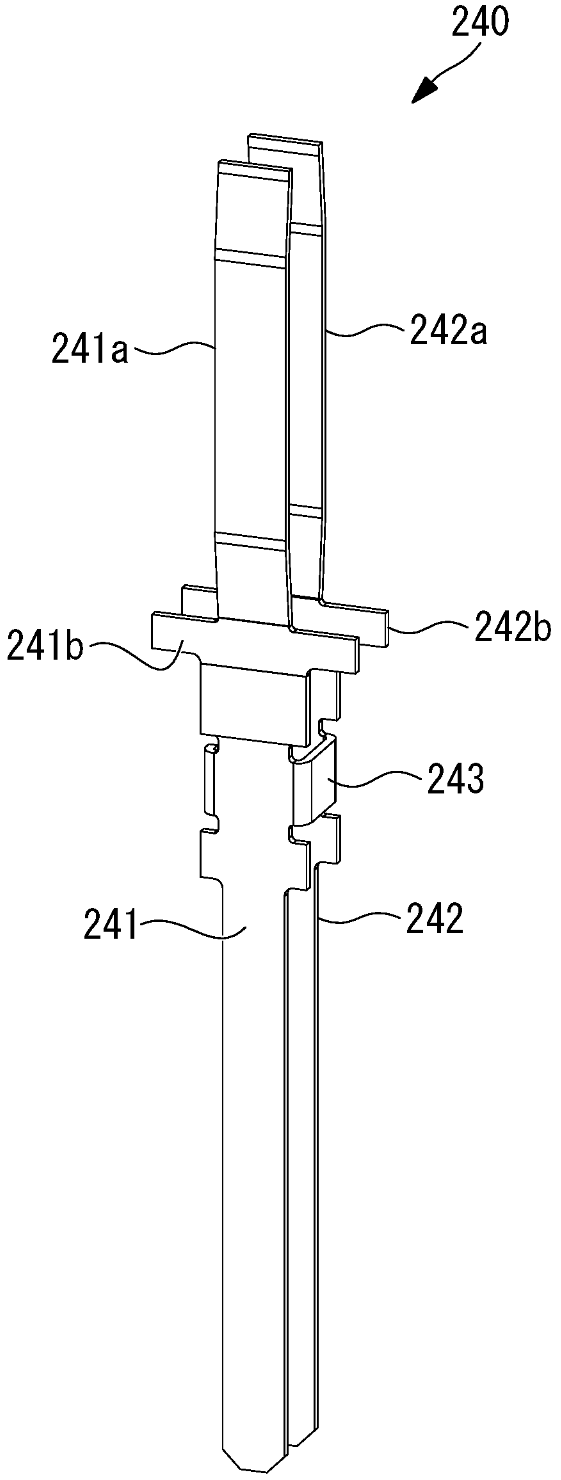
FIG. 29 is a perspective view of a casing according to a modified example.
Figure 31:
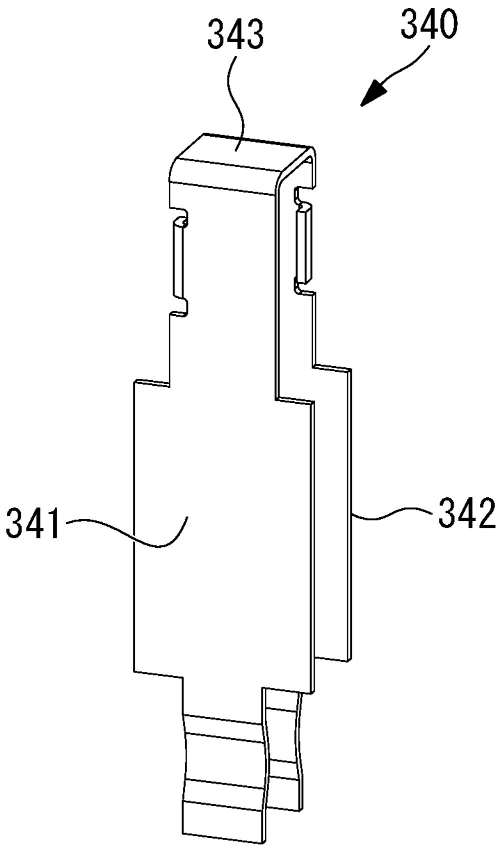
FIG. 31 is a perspective view of the casing according to the modified example.

Other than the casing 140 illustrated in FIG. 18, for example, a casing 240 illustrated in FIG. 29 or a casing 340 illustrated in FIG. 31 may be used to bundle the electrical contacts 110 and/or the thermal contacts 120.

<Casing 240>

As illustrated in FIG. 29, the casing 240 has a first plate-like part 241, a second plate-like part 242 facing the first plate-like part 241, and a connecting plate-like part 243 connecting these plate-like parts to each other.

The first plate-like part 241 is a plate-like portion extending in the same direction as the thermal contact 120.

In the first plate-like part 241, a movable piece 241*a* is formed in the upper part, and a wider part 241*b* is formed in the middle.

The movable piece 241*a* has a tip part inclined to the second plate-like part 242 side, and this tip part is elastically contacted to the base end side plate-like part 121 of the thermal contact 120 located at the outermost face.

The wider part 241*b* is a portion where both side faces of the first plate-like part 241 are partially widened in the width direction and is contacted to the wider part 123*a* of the thermal contact 120 located at the outermost face.

The second plate-like part 242 is a plate-like portion extending in the same direction as the thermal contact 120.

In the second plate-like part 242, a movable piece 242*a* is formed in the upper part, and a wider part 242*b* is formed in the middle.

The movable piece 242*a* has a tip part inclined to the first plate-like part 241 side, and this tip part is elastically contacted to the base end side plate-like part 121 of the thermal contact 120 located at the outermost face.

The wider part 242*b* is a portion where both side faces of the second plate-like part 242 are partially widened in the width direction and is contacted to the wider part 123*a* of the outermost thermal contact 120.

The connecting plate-like part 243 is a plate-like portion connecting the first side face of the first plate-like part 241 and the first side face of the second plate-like part 242 to each other below the wider part 241*b* and the wider part 242*b*.

Figure 30:
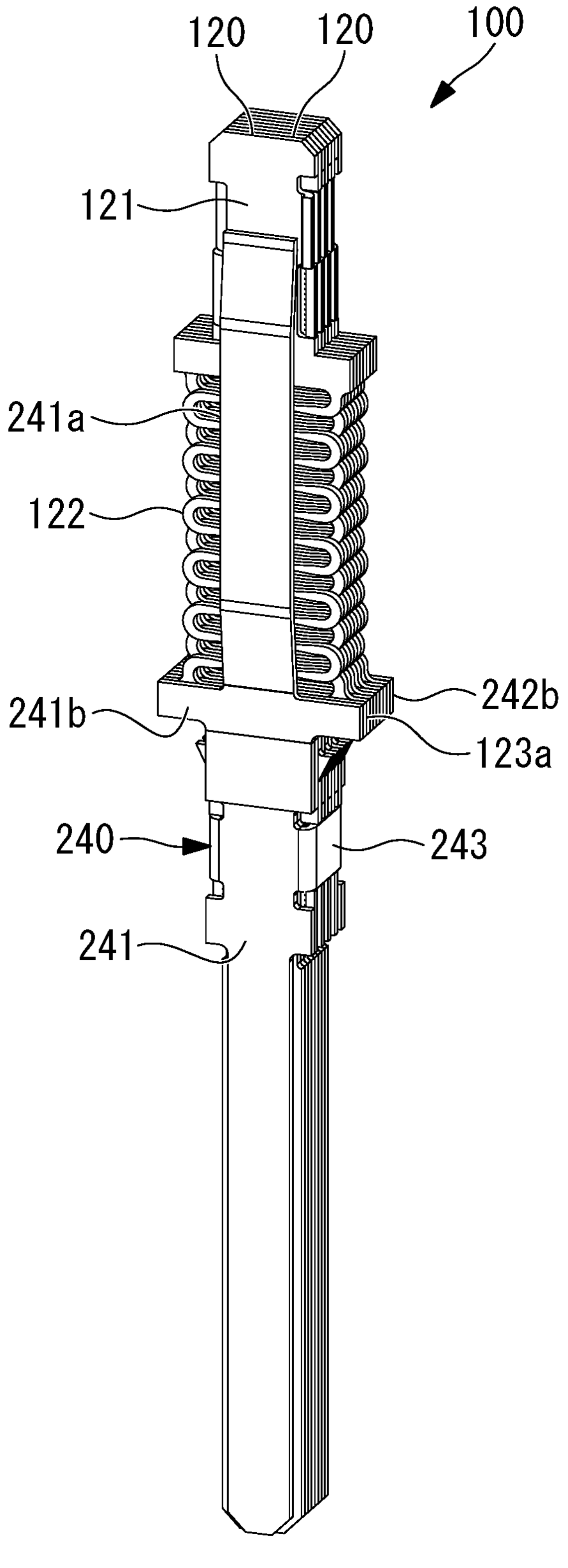
FIG. 30 is a perspective view of the contact pin.

The casing 240 configured as set forth is fitted from the side of the thermal contact 120 so that the laterally stacked thermal contacts 120 are inserted between the first plate-like part 241 and the second plate-like part 242, as illustrated in FIG. 30.

In this state, the first plate-like part 241 is in contact with the thermal contact 120 so as to bypass the elastic deformation part 122 by the tip part of the movable piece 241*a* and the wider part 241*b*.

Further, the second plate-like part 242 is in contact with the thermal contact 120 so as to bypass the elastic deformation part 122 by the tip part of the movable piece 242*a* and the wider part 242*b*.

Accordingly, a path bypassing the elastic deformation part 112 and the elastic deformation part 122 having long paths and thus having high electrical resistance or thermal resistance can be formed by using the casing 240. Further, variation in the thicknesses of the laterally stacked thermal contacts 120 can be efficiently absorbed.

Note that, in the contact pin 100 illustrated in FIG. 30, the casing 240 bundles only the thermal contacts 120 but may bundle the electrical contacts 110 or the thermal contacts 130 or a combination thereof in the same manner as the casing 140.

<Casing 340>

As illustrated in FIG. 31, the casing 340 has a first plate-like part 341, a second plate-like part 342 facing the first plate-like part 341, and a connecting plate-like part 343 connecting these plate-like parts to each other.

The first plate-like part 341 is a plate-like portion extending in the same direction as the thermal contact 120.

The first plate-like part 341 has a bent part convex to the second plate-like part 342 side at the tip, and this bent part is contacted to the tip side plate-like part 123 of the outermost thermal contact 120.

The second plate-like part 342 is a plate-like portion extending in the same direction as the thermal contact 120.

The second plate-like part 342 has a bent part convex to the first plate-like part 341 side at the tip, and this bent part is contacted to the tip side plate-like part 123 of the outermost thermal contact 120.

The connecting plate-like part 343 is a plate-like portion connecting the top face of the first plate-like part 341 and the top face of the second plate-like part 342 to each other.

In this state, the first plate-like part 341 and the second plate-like part 342 are elastically connected to the connecting plate-like part 343.

Figure 32:
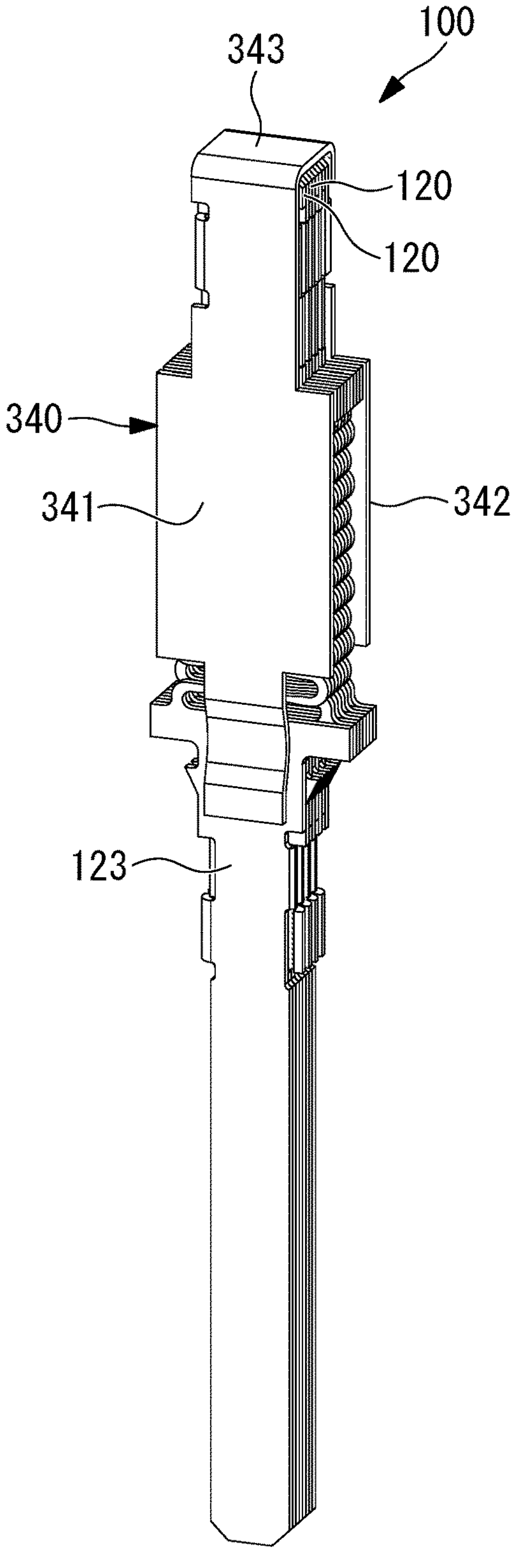
FIG. 32 is a perspective view of the contact pin.

The casing 340 configured as set forth is fitted from above of the thermal contact 120 so that the laterally stacked thermal contacts 120 are inserted between the first plate-like part 341 and the second plate-like part 342, as illustrated in FIG. 32.

In this state, the connecting plate-like part 343 is in contact with the upper faces of all the thermal contacts 120.

Note that, in the contact pin 100 illustrated in FIG. 32, the casing 340 bundles only the thermal contacts 120 but may bundle the thermal contacts 130 or a combination thereof.

According to the present embodiment, the following effects and advantages are achieved.

That is, since the electric conductive casing 140 that bundles a plurality of laterally stacked contacts (for example, the electrical contact 110 and the thermal contact 120) is provided, and the casing 140 is in contact with the contacts so as to form a path bypassing the elastic deformation part, it is possible to transfer electricity or heat from the base end to the portion on the tip side of the electrical contact 110 and the thermal contact 120 while bypassing the elastic deformation part 112, 122 having complex structure. This can improve the electrical performance or thermal performance.

Further, a cost reduction or a shorter delivery time can be realized by the simplified structure or molding by press machining.

Further, since the casing has the same electrical conductivity as or higher electrical conductivity than the electrical contact 110 and the thermal contact 120, the electrical performance can be further improved.

Further, since the casing 140 has the second plate-like part 142 that is contacted to the electrical contact 110 located at one outermost face of the plurality of laterally stacked contacts (for example, the electrical contact 110 and the thermal contact 120) and a movable piece 141*d* that is elastically contacted to the thermal contact 120 located at the other outermost face of the plurality of laterally stacked contacts, the casing 140 can collectively, stably hold the contacts.

Further, since two casings 140 are provided and overlapped with each other to bundle the plurality of laterally stacked contacts (for example, the electrical contact 110 and the thermal contact 120), the area of the casing 140 in contact with the electrical contact 110 and the thermal contact 120 is increased, and thereby the electrical performance or thermal performance can be further improved.

Further, since the casing 140 has the stopper (the connecting plate-like part 143) configured to restrict the amount of compression of the electrical contact 110 and the thermal contact 120, it is possible to prevent the electrical contact 110 and the thermal contact 120 from being excessively compressed and damaged.

Further, since the contact protruding part 111*f* protruding in the extending direction is formed on the base end of the electrical contact 110, the contact protruding part 111*f* will be in contact with the IC package 20, and the contact pressure can be increased compared to a case of surface contact. This can improve the electrical performance of the contact pin 100.

Further, since the base end of the thermal contact 120 is formed planar, the thermal contact 120 will be in contact with the IC package 20 at a surface, and the contact area can be increased. This can improve the thermal performance of the contact pin 100.

Further, the contact protruding part 111*f* protruding in the extending direction is formed on the base end of the electrical contact 110, the base end of the thermal contact 120 is formed planar, and the base end formed planar is at substantially the same height position as the contact protruding part 111*f*. Thus, contacts for different purposes can be combined into a single contact pin 100, for example, the electrical contacts 110 having the contact protruding part 111*f* formed thereon may be used for electrical contact, while the thermal contacts 120 having planarly formed base end may be used for thermal contact.

REFERENCE SIGNS LIST

10 socket for inspection
11 lower housing
11*a* lower recess
11*b* lower through hole
12 upper housing
12*a* upper recess
12*b* upper through hole
13 stage
14 movable housing
14*a* package accommodating part
15 accommodating space
16 peripheral contact pin
20 IC package
100 contact pin
110 electrical contact (contact)
111 base end side plate-like part
111*a* wider part
111*b* upper claw
111*c* upper notch
111*d* lower claw
111*e* lower notch
111*f* contact protruding part
111g protrusion (front side)
111*h* protrusion (backside)
112 elastic deformation part
112*a* upper end
112*b* lower end
113 tip side plate-like part
113*a* wider part
113*b* upper claw
113*c* upper notch
113*d* lower claw
113*e* lower notch
113*h* press-fit claw
113*i* protrusion (front side)
113*j* protrusion (backside)
120 thermal contact (contact)
121 base end side plate-like part
121*a* wider part
121*b* upper claw
121*c* upper notch
121*d* lower claw
121*e* lower notch
121g protrusion (front side)
121*h* protrusion (backside)
122 elastic deformation part
122*a* upper end
122*b* lower end
123 tip side plate-like part
123*a* wider part
123*b* upper claw
123*c* upper notch
123*d* lower claw
123*e* lower notch
123*h* press-fit claw
123*i* protrusion (front side)
123*j* protrusion (backside)
130 thermal contact (contact)
131 base end side plate-like part
131*a* wider part
131*b* upper claw
131*c* upper notch
131*d* lower claw
131*e* lower notch
140 casing
141 first plate-like part
141*a* protrusion
141*b* wider part
141*c* notch
141*d* movable piece
141*h* press-fit claw
142 second plate-like part (stationary piece)
142*a* protrusion
142*b* wider part
142*c* notch
142*d* base end holding part
142*e* tip holding part
142*h* press-fit claw
143 connecting plate-like part
240 casing
241 first plate-like part
241*a* movable piece
241*b* wider part
242 second plate-like part
242*a* movable piece
242*b* wider part
243 connecting plate-like part
340 casing
341 first plate-like part
342 second plate-like part
343 connecting plate-like part

The invention claimed is:

1. A contact pin comprising:

a plurality of contacts having electrical conductivity, each of the contacts extending from a base end to a tip and having an elastic deformation part formed between the base end and the tip, and the elastic deformation part being elastically expandable and compressible in an extending direction; and two casings having electrical conductivity, wherein the plurality of contacts are laterally stacked adjacent to each other and movable independent of each other, wherein the casings bundle the plurality of laterally stacked contacts, and the casings are in contact with the contacts so as to form a path bypassing the elastic deformation part, wherein each casing has a first plate-like part and a second plate-like part that face each other and between which the laterally stacked contacts are arranged, wherein in a state where both the casings overlap with each other, the first plate-like part of one of the casings faces the second plate-like part side of the other of the casings, and the second plate-like part of each of the casings faces the laterally stacked contacts.

2. The contact pin according to claim 1, wherein the casings have the same electrical conductivity as or higher electrical conductivity than the contacts.

3. The contact pin according to claim 1, wherein the casings are overlapped with each other to bundle the plurality of laterally stacked contacts.

4. The contact pin according to claim 3, wherein each of the casings has a stationary piece that is contacted to a contact located at one outermost face of the plurality of laterally stacked contacts and a movable piece that is elastically contacted to a contact located at the other outermost face of the plurality of laterally stacked contacts.

5. The contact pin according to claim 1, wherein the casings have a movable piece that is elastically contact to a contact located at one outermost face of the plurality of laterally stacked contacts and another movable piece that is elastically contact to a contact located at the other outermost face of the plurality of laterally stacked contacts.

6. The contact pin according to claim 1, wherein the first plate-like part has a protrusion protruding toward the second plate-like part side, and wherein the second plate-like part has a protrusion protruding toward the first plate-like part side.

7. The contact pin according to claim 1, wherein a movable piece that is elastically contacted to a contact located at the outermost face is formed to the first plate-like part.

8. The contact pin according to claim 1, wherein the casings have a stopper configured to restrict an amount of compression of the contact.

9. The contact pin according to claim 1, wherein a protruding part protruding in the extending direction is formed on the base end of each of the plurality of contacts.

10. The contact pin according to claim 1, wherein the base end of each of the plurality of contacts is formed planar.

11. The contact pin according to claim 1, wherein a protruding part protruding in the extending direction is formed on the base end of some of the contacts, wherein the base end of the others of the contacts is formed planar, and wherein the base end formed planar is at substantially the same height position as the protruding part.

12. A socket for inspection comprising:

a plurality of contact pins according to claim 1; and a housing configured to accommodate the contact pins.

13. The socket for inspection according to claim 12, wherein the housing has an upper housing and a lower housing that define a space in which the elastic deformation parts of the contact pins are accommodated, and wherein the contact pins are configured such that the elastic deformation parts are compressed by the upper housing and the lower housing.

* * * * *